United States Patent [19]
Qian et al.

[11] Patent Number: 5,919,382
[45] Date of Patent: Jul. 6, 1999

[54] AUTOMATIC FREQUENCY TUNING OF AN RF POWER SOURCE OF AN INDUCTIVELY COUPLED PLASMA REACTOR

[75] Inventors: Xue-Yu Qian, Milpitas; Arthur Sato, San Jose, both of Calif.

[73] Assignee: Applied Materials, Inc., Santa Clara, Calif.

[21] Appl. No.: 08/720,588

[22] Filed: Sep. 30, 1996

Related U.S. Application Data

[63] Continuation-in-part of application No. 08/332,569, Oct. 31, 1994, abandoned.

[51] Int. Cl.⁶ .................................................. B23K 10/00
[52] U.S. Cl. .............................. 219/121.52; 219/121.43; 219/121.4; 156/345; 204/298.34; 118/723 I
[58] Field of Search ........................... 219/121.43, 121.4, 219/121.44, 121.52; 156/643.1, 646.1, 345; 204/298.02, 298.17, 298.34; 118/723 I, 723 IR, 723 E, 723 MP

[56] References Cited

U.S. PATENT DOCUMENTS

| | | | |
|---|---|---|---|
| 5,194,731 | 3/1993 | Turner . | |
| 5,401,350 | 3/1995 | Patrick et al. | 156/345 |
| 5,558,722 | 9/1996 | Okumura et al. | 18/723 I |

FOREIGN PATENT DOCUMENTS

| | | |
|---|---|---|
| 413 282 AO | 2/1991 | European Pat. Off. . |
| 0596551 | 5/1994 | European Pat. Off. . |
| 0 596 551 AO | 11/1994 | European Pat. Off. . |
| 0 710 055 A1 | 10/1995 | European Pat. Off. . |
| 0 727 807 A1 | 1/1996 | European Pat. Off. . |
| 0 727 723 A1 | 2/1996 | European Pat. Off. . |
| 2 231 197 | 11/1990 | United Kingdom . |
| 91 10341 | 7/1991 | WIPO . |

*Primary Examiner*—Mark Paschall
*Attorney, Agent, or Firm*—Robert Wallace

[57] ABSTRACT

The invention is embodied in a coil antenna for radiating RF power supplied by an RF source into a vacuum chamber of an inductively coupled plasma reactor which processes a semiconductor wafer in the vacuum chamber, the reactor having a gas supply inlet for supplying processing gases into the vacuum chamber, the coil antenna including plural concentric spiral conductive windings, each of the windings having an interior end near an apex of a spiral of the winding and an outer end at a periphery of the spiral of the winding, and a common terminal connected to the interior ends of the plural concentric spiral windings, the RF power source being connected across the terminal and the outer end of each one of the windings. In embodiment, the inner ends of the concentric spiral windings are connected radially outwardly of a common conductor rather than inwardly to an apex terminal. In another embodiment, the concentric spiral windings are each powered at a point intermediate the radially inner and outer ends. In yet another embodiment, there are plural radially separate groups of concentric spiral windings, each connected to a separately controlled RF power source to enable adjustment of radial distribution of the plasma ion density. In a further embodiment, the spiral concentric windings are not conformal with the shape of the chamber ceiling, and can extend above the ceiling.

56 Claims, 23 Drawing Sheets

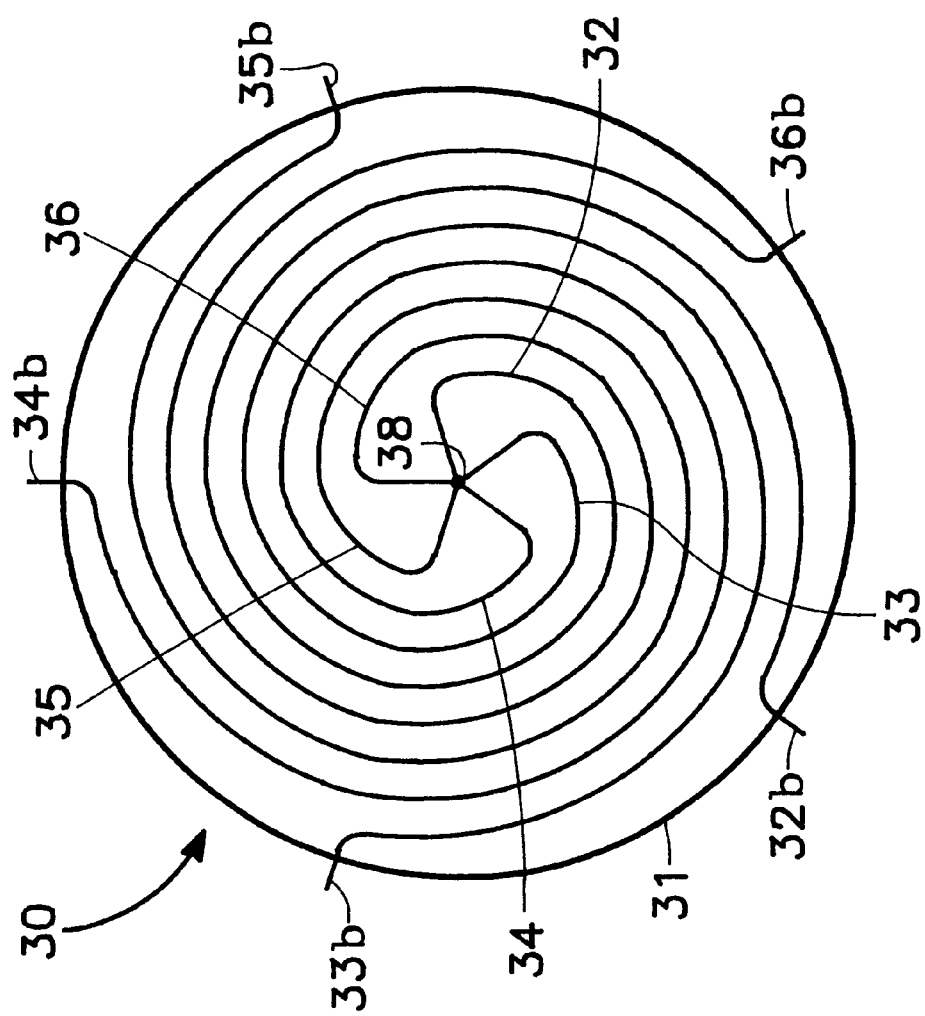

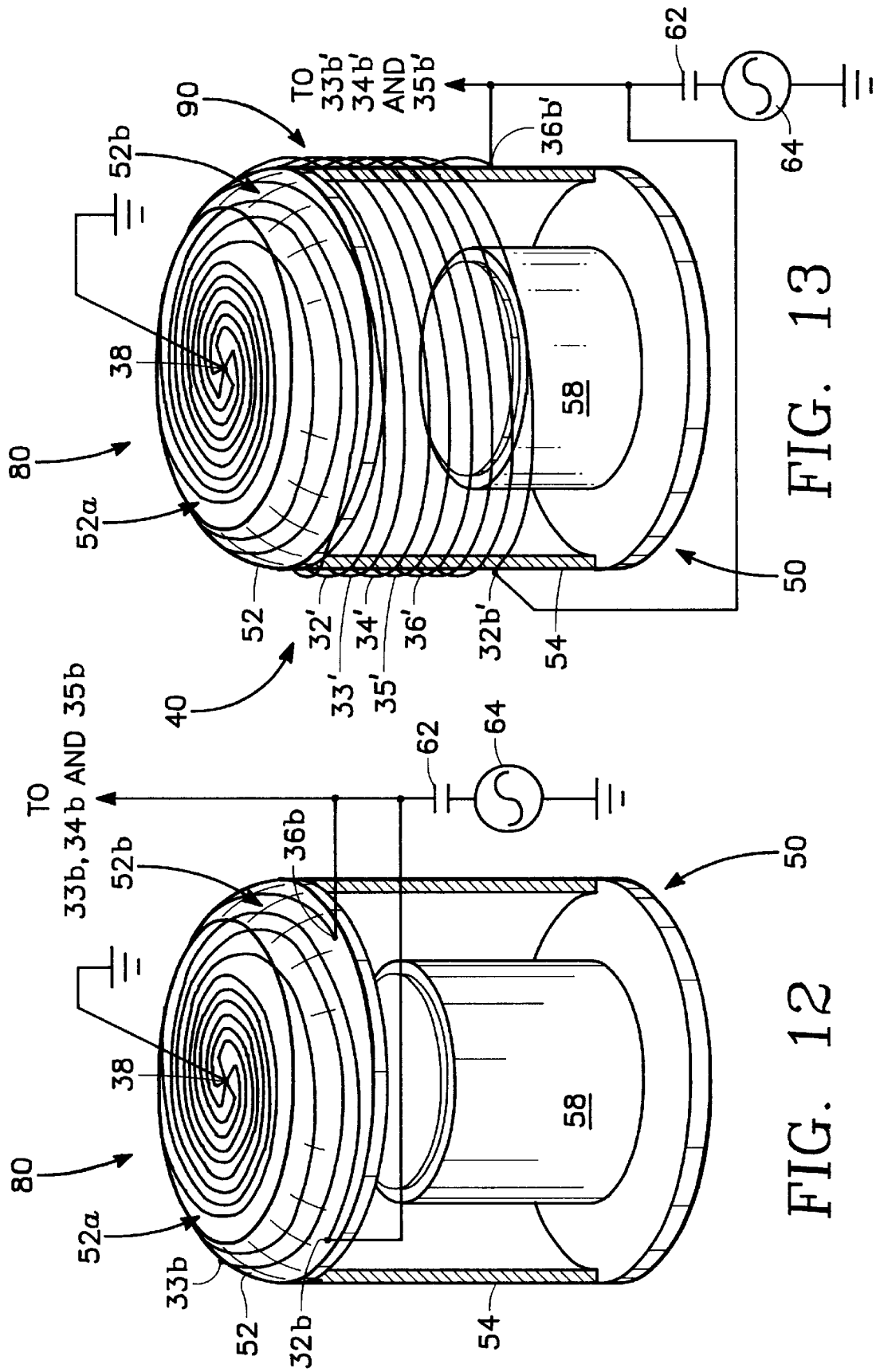

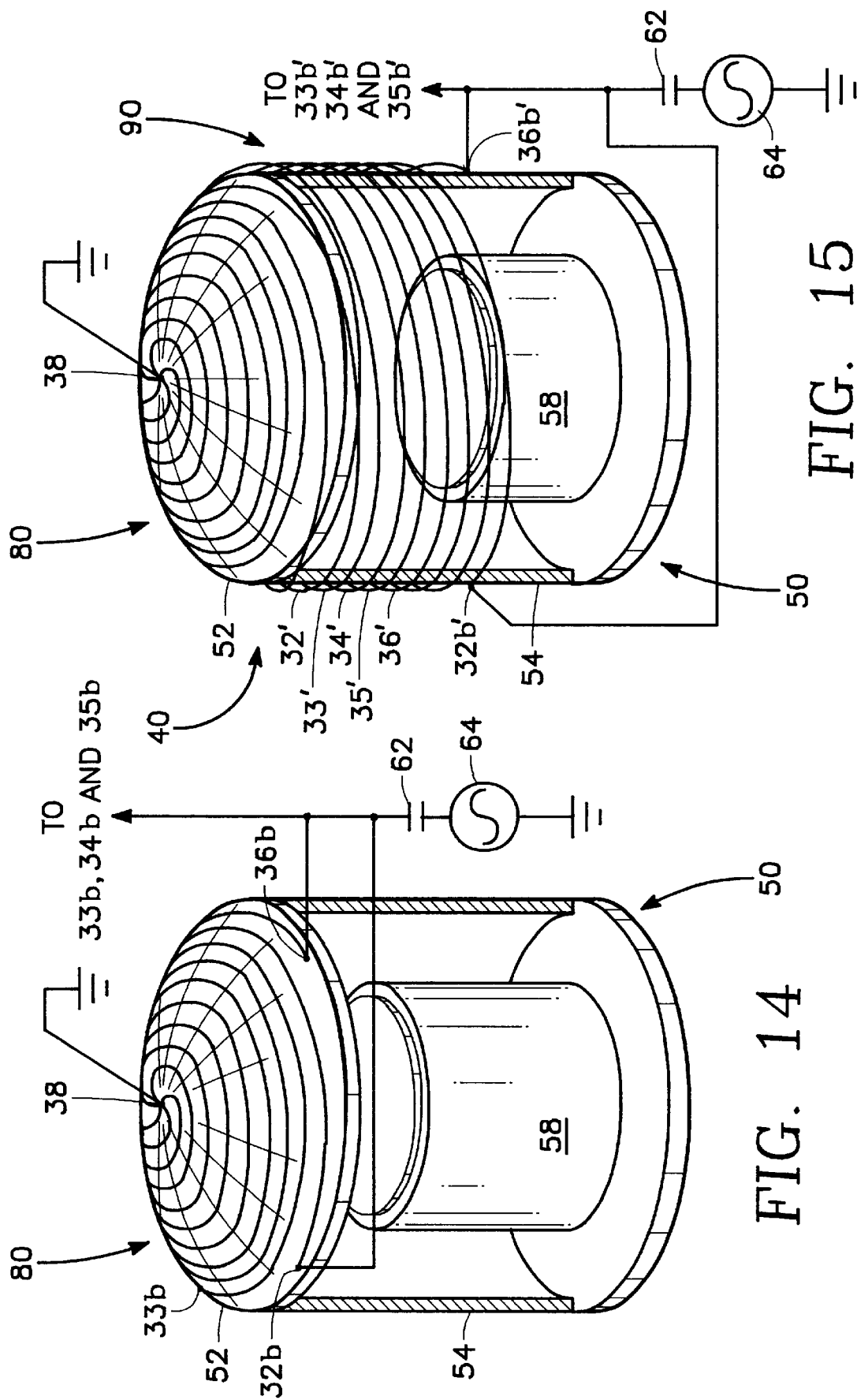

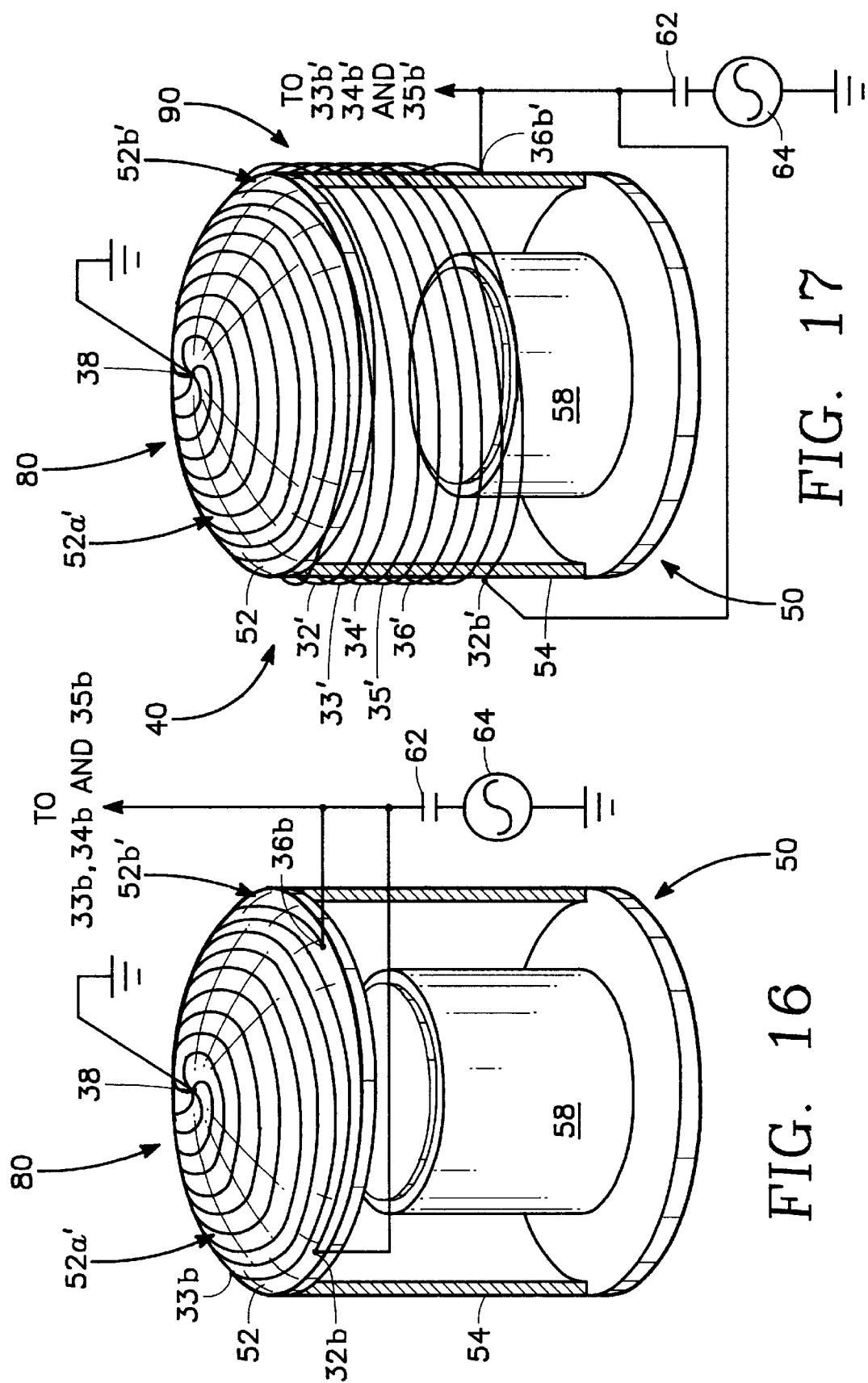

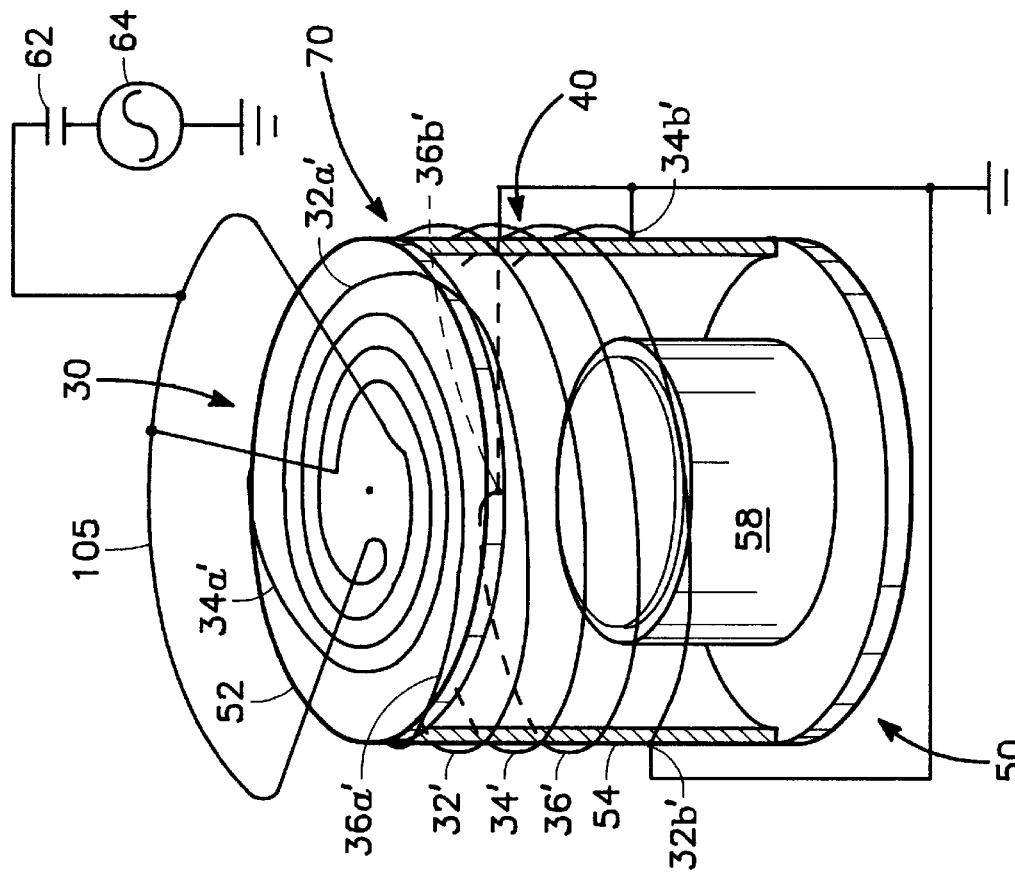
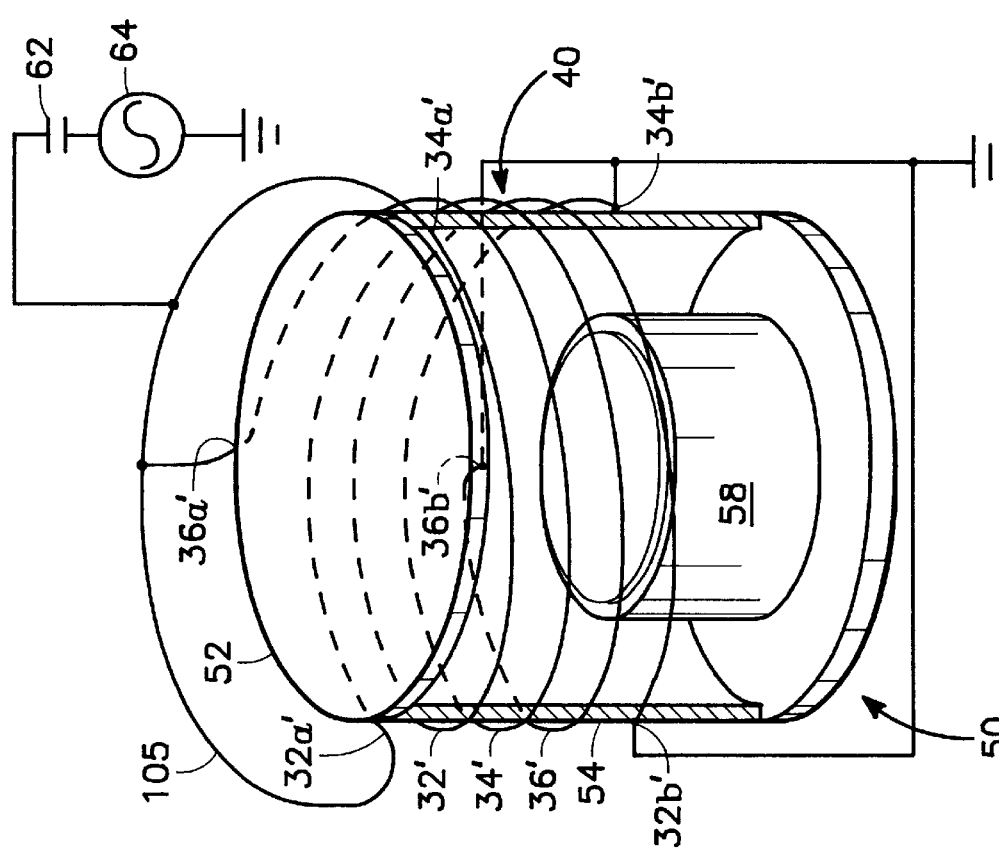

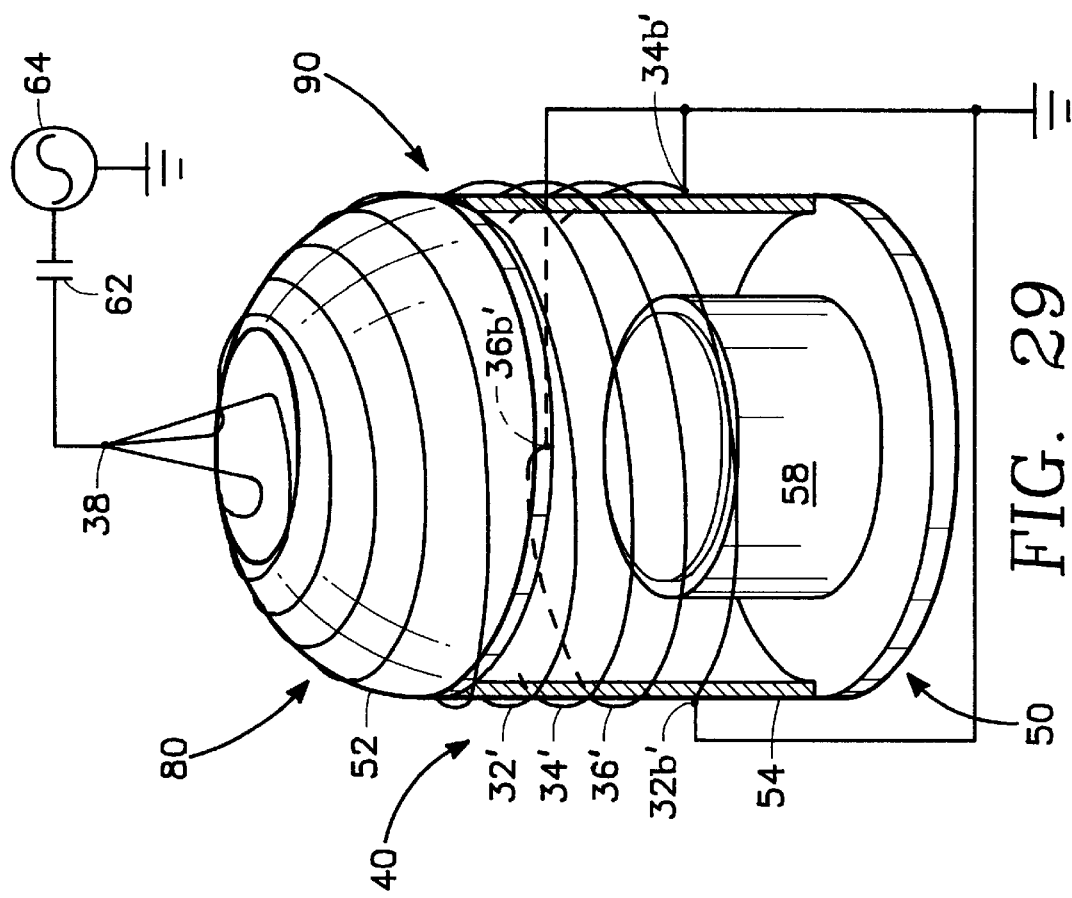
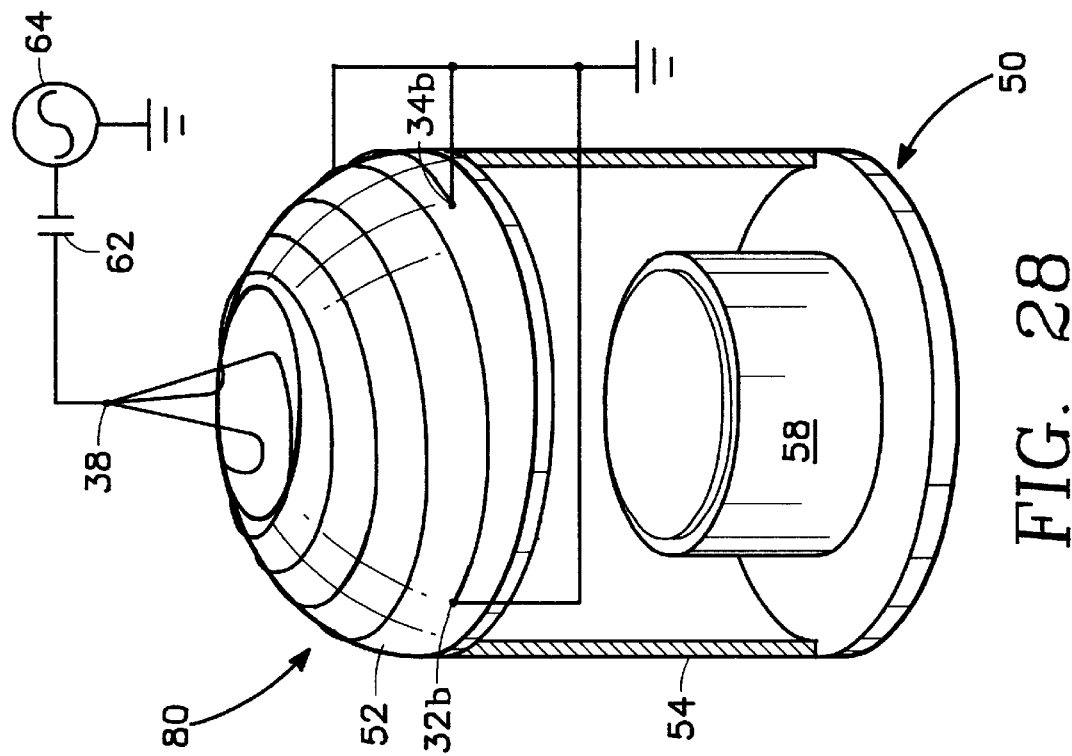

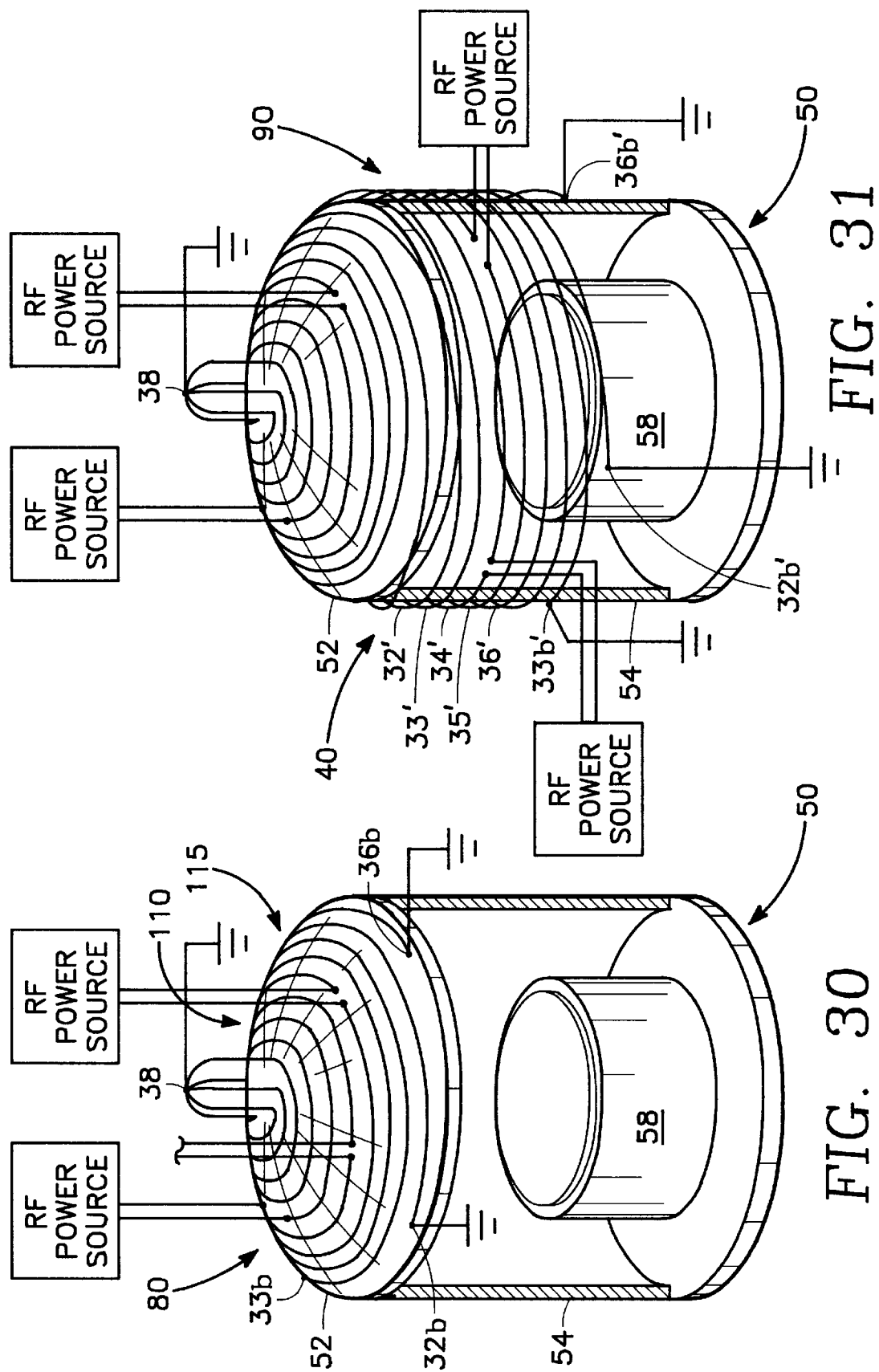

AUTOMATIC FREQUENCY TUNING OF AN RF POWER SOURCE OF AN INDUCTIVELY COUPLED PLASMA REACTOR

CROSS REFERENCE TO RELATED APPLICATIONS

This application is a continuation in part of U.S. Ser. No. 08/332,569 filed Oct. 31, 1994 now abandoned by Xue-Yu Qian et al. and entitle "INDUCTIVELY COUPLED PLASMA REACTOR WITH SYMMETRICAL PARALLEL MULTIPLE COILS HAVING A COMMON RF TERMINAL".

BACKGROUND OF THE INVENTION

1. Technical Field

The invention is related to fabrication of microelectronic integrated circuits with a inductively coupled RF plasma reactor and particularly to such reactors having coiled RF antennas providing a highly uniform plasma distribution.

2. Background Art

Inductively coupled plasma reactors are employed where high density inductively coupled plasmas are desired for processing semiconductor wafers. Such processing may be etching, chemical vapor deposition and so forth. Inductively coupled reactors typically employ a coiled antenna wound around or near a portion of the reactor chamber and connected to an RF power source. In order to provide a uniform etch rate or deposition rate across the entire surface of a wafer, the plasma density provided by the coiled antenna must be uniform across the surface of the semiconductor wafer. One attempt to provide such a uniform field is to wind the coiled antenna in a flat disk parallel to overlying the wafer, as disclosed in U.S. Pat. No. 4,948,458 to Ogle. This concept is depicted in FIG. 1.

One problem with the flat coiled antenna of FIG. 1 is that there is a large potential difference between the center of the antenna and the circumferential edge thereof, with the result that the plasma can have a high ion density or "hot spot" over the center of the wafer and a lower ion density at the wafer periphery. This in turn causes the etch rate—or deposition rate—to be nonuniform across the wafer surface. One way of ameliorating this problem is to limit the power applied to the antenna coil to a few hundred watts so as to minimize the plasma non-uniformity. This approach is not completely satisfactory because it limits the etch rate (or deposition rate), thereby reducing throughput or productivity of the reactor, and moreover does not solve the problem of process non-uniformity across the wafer surface.

Another problem with inductively coupled reactors is that any high voltage induced on the antenna coil leads to capacitive coupling of RF power to the plasma. In other words, capacitive coupling of RF power from the coiled antenna to the plasma increases with the voltage an the coiled antenna. Such capacitive coupling increases the ion kinetic energy which makes it difficult for the user to precisely control ion kinetic energy and thereby control sputtering rate or etch rate. Capacitive coupling is particularly pronounced in the flat disk coil antenna of FIG. 1.

Therefore, there is a need for an inductively coupled plasma reactor having a coiled antenna which provides a highly uniform plasma across the wafer surface at high power with only minimal capacitive coupling.

SUMMARY OF THE INVENTION

The invention is embodied in a coil antenna for radiating RF power supplied by an RF source into a vacuum chamber of an inductively coupled plasma reactor which processes a semiconductor wafer in the vacuum chamber, the reactor having a gas supply inlet for supplying processing gases into the vacuum chamber, the coil antenna including plural concentric spiral conductive windings, each of the windings having an interior end near an apex of a spiral of the winding and an outer end at a periphery of the spiral of the winding, and a common terminal connected to the interior ends of the plural concentric spiral windings, the RF power source being connected across the terminal and the outer end of each one of the windings. In a preferred embodiment, the RF power source includes two terminals, one of the two terminals being an RF power terminal and the other of the two terminals being an RF return terminal which is connected to ground, the common terminal of the plural concentric spiral conductive windings being connected to one of the RF source terminals and the outer ends of the plural concentric spiral conductive windings being connected to the other RF source terminal.

In one embodiment, the inner ends of the concentric spiral windings are connected radially outwardly to a common conductor rather than inwardly to an apex terminal. In another embodiment, the concentric spiral windings are each powered at a point intermediate the radially inner and outer ends. In one version of this embodiment, separately controlled RF power sources are connected to the two ends and the intermediate point is a common RF return. In yet another embodiment, there are plural radially separate groups of concentric spiral windings, each connected to a separately controlled RF power source to enable adjustment of radial distribution of the plasma ion density. In a further embodiment, the spiral concentric windings are not conformal with the shape of the chamber ceiling, and can extend above the ceiling. In a related embodiment, the reactor includes a dome-shaped ceiling and the antenna coil has a dome shape and wicks upwardly at the apex away from the dome shaped ceiling.

BRIEF DESCRIPTION OF THE DRAWINGS

FIG. 3B is a top view of a flat disk coil antenna corresponding to FIG. 3A but having a greater number of windings.

FIG. 12 is a perspective view of an embodiment of the invention having a truncated dome ceiling forming a chamfered corner along the circumference of the ceiling.

FIG. 13 is a perspective view of a variation of the embodiment of FIG. 12 including a cylindrical winding.

FIG. 14 is a perspective view of an embodiment of the invention having a shallow or partial dome-shaped ceiling.

FIG. 15 is a perspective view of a variation of the embodiment of FIG. 14 including a cylindrical winding.

FIG. 16 is a perspective view of an embodiment of the invention having a shallow dome-shaped ceiling with a chamfered corner along its circumference.

FIG. 17 is a perspective view of a variation of the embodiment of FIG. 16 including a cylindrical winding.

FIG. 26 illustrates a cylindrical shaped multiple spiral coil whose inner ends are connected radially outwardly to a common connector bus.

FIG. 27 illustrates an embodiment corresponding to FIG. 26 and having in addition an overhead multiple spiral concentric coil.

FIG. 28 illustrates an embodiment corresponding to FIG. 26 having a truncated dome shape.

FIG. 29 illustrates an embodiment corresponding to FIG. 27 having a truncated dome shape.

FIG. 30 illustrates a concentric multiple spiral coil divided into separate inner and outer multiple spiral coils independently driven by separate RF power sources.

FIG. 31 illustrates an embodiment corresponding to FIG. 30 in which the inner and outer coils are overhead and side coils respectively.

DETAILED DESCRIPTION OF THE PREFERRED EMBODIMENTS

Figure 2:
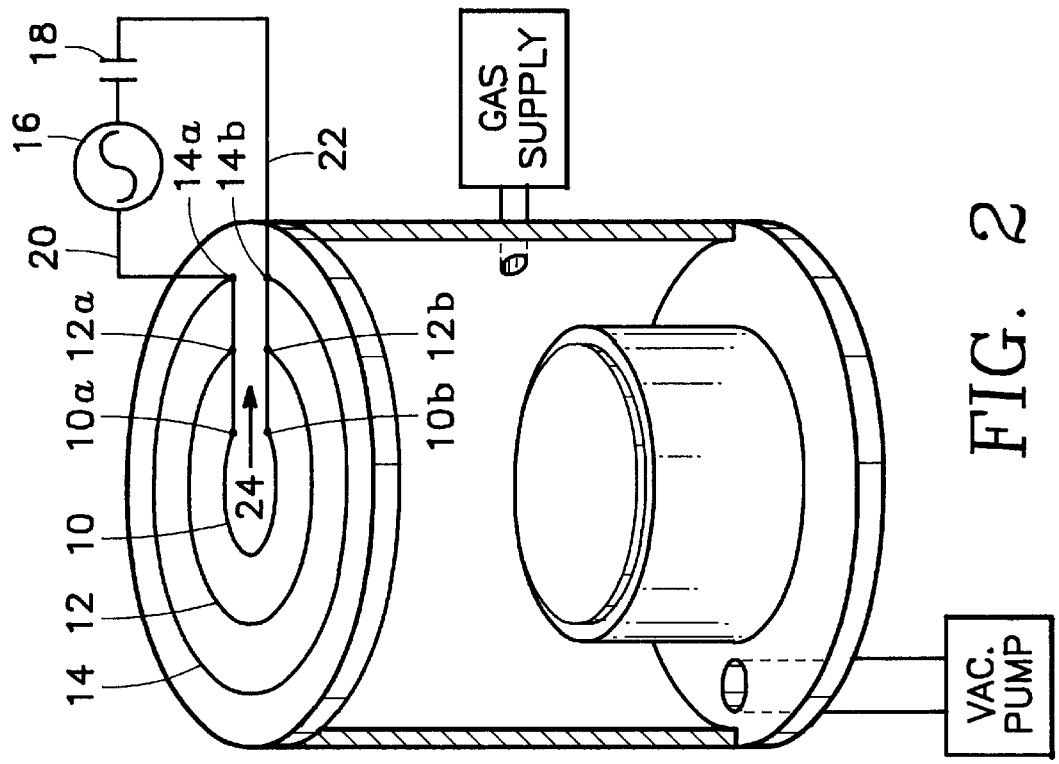
FIG. 2 is a simplified diagram of a coil antenna having its windings connected in parallel across an RF source.

In an inductively coupled plasma reactor having an RF antenna coil adjacent the reactor chamber, it is a goal of the invention to reduce the voltage on the coil. One possible approach to reduce coil voltage is to reduce the amount of inductance in the winding of the coil antenna. This would reduce the potential V across each winding (since V=L di/dt, where L is the winding inductance and i is the winding current), this reduction in electric potential reducing capacitive coupling to the plasma. FIG. 2 illustrates one way of accomplishing this by connecting all of the coil windings 10, 12, 14 in parallel across the RF power source 16, 18 via conductors 20, 22. One end 10a, 12a, 14a of each winding is connected to the conductor 20 while the other end 10b, 12b, 14b is connected to the other conductor 22. The problem is that the gap 24 between the conductors 20, 22 gives rise to a discontinuity in the RF field over the wafer. Thus, for example, in a plasma etch reactor employing the coiled antenna of FIG. 2, the discontinuity of the coil can often cause azimuthal asymmetry in the plasma density across the wafer surface. Accordingly, the coil antenna of FIG. 2 does not provide a uniform plasma density and therefore does not fulfill the need.

Figure 3A:
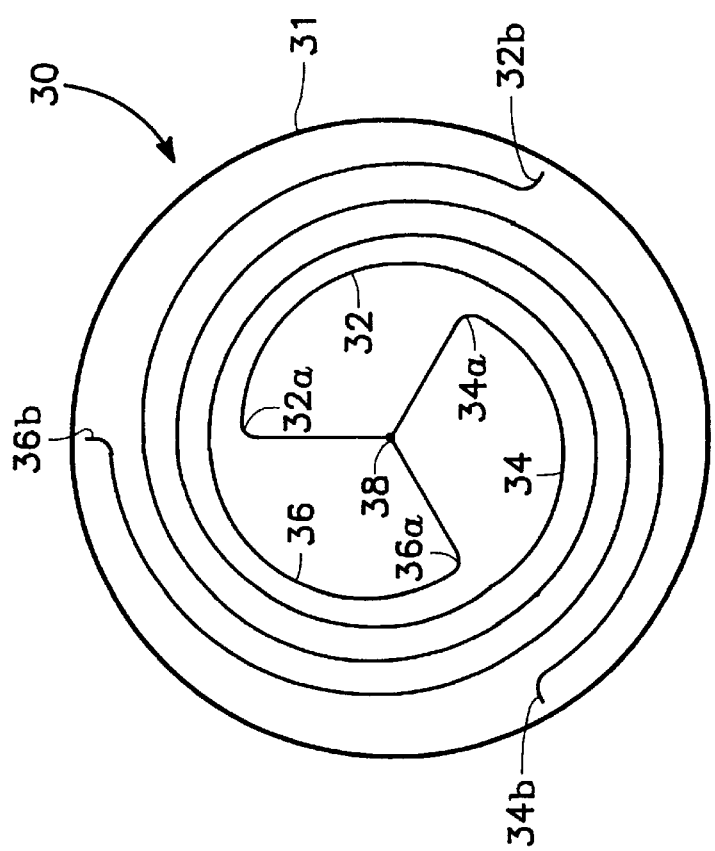
FIG. 3A is a top view of a flat disk coil antenna for a plasma reactor in accordance with a first embodiment of the invention.
Figure 4:
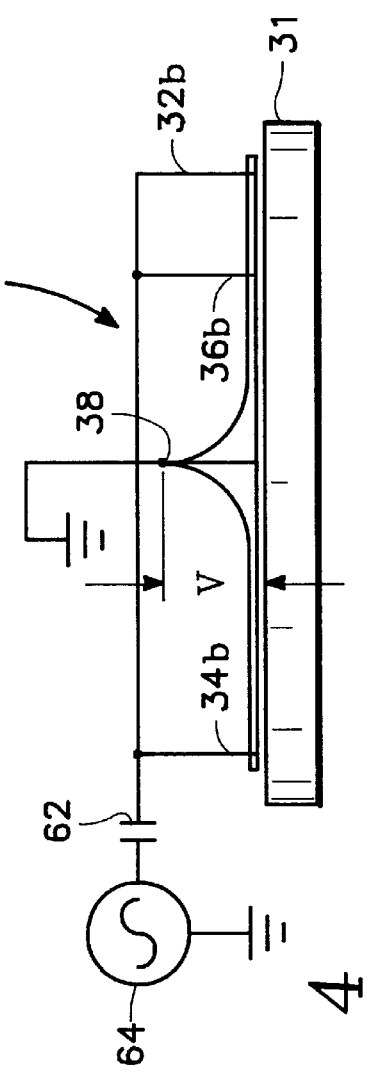
FIG. 4 is a side view corresponding to FIG. 3A.

Referring to FIGS. 3A and 4, a coil antenna 30 overlies the ceiling of a reactor chamber 31, the coil antenna 30 having plural concentric spiral windings 32, 34, 36 connected in parallel across a capacitor 62 and an RF source 64.

The windings 32, 34, 36 have inner ends 32a, 34a, 36a near the center of the spirals and outer ends 32b, 34b, 36b at the peripheries of the spirals. The inner ends 32a, 34a, 36a are connected together at a common apex terminal 38. In the preferred embodiment, the common apex terminal 38 is connected to ground while the outer winding ends 32b, 34b, 36b are connected to the RF source 64. As shown in FIG. 4, the straight central inner arms of the windings 32, 34, 36 preferably wick vertically upwardly away from the reactor top to the apex terminal 38 by a vertical distance v of about 2 cm. FIG. 3B illustrates a 5-winding version of the coil antenna of FIG. 3A, including concentric windings 32, 33, 34, 35, 36 with inner endings 32a, 33a, 34, 35a, 36a and outer endings 32b, 33b, 34b, 35b, 36b.

Figure 5:
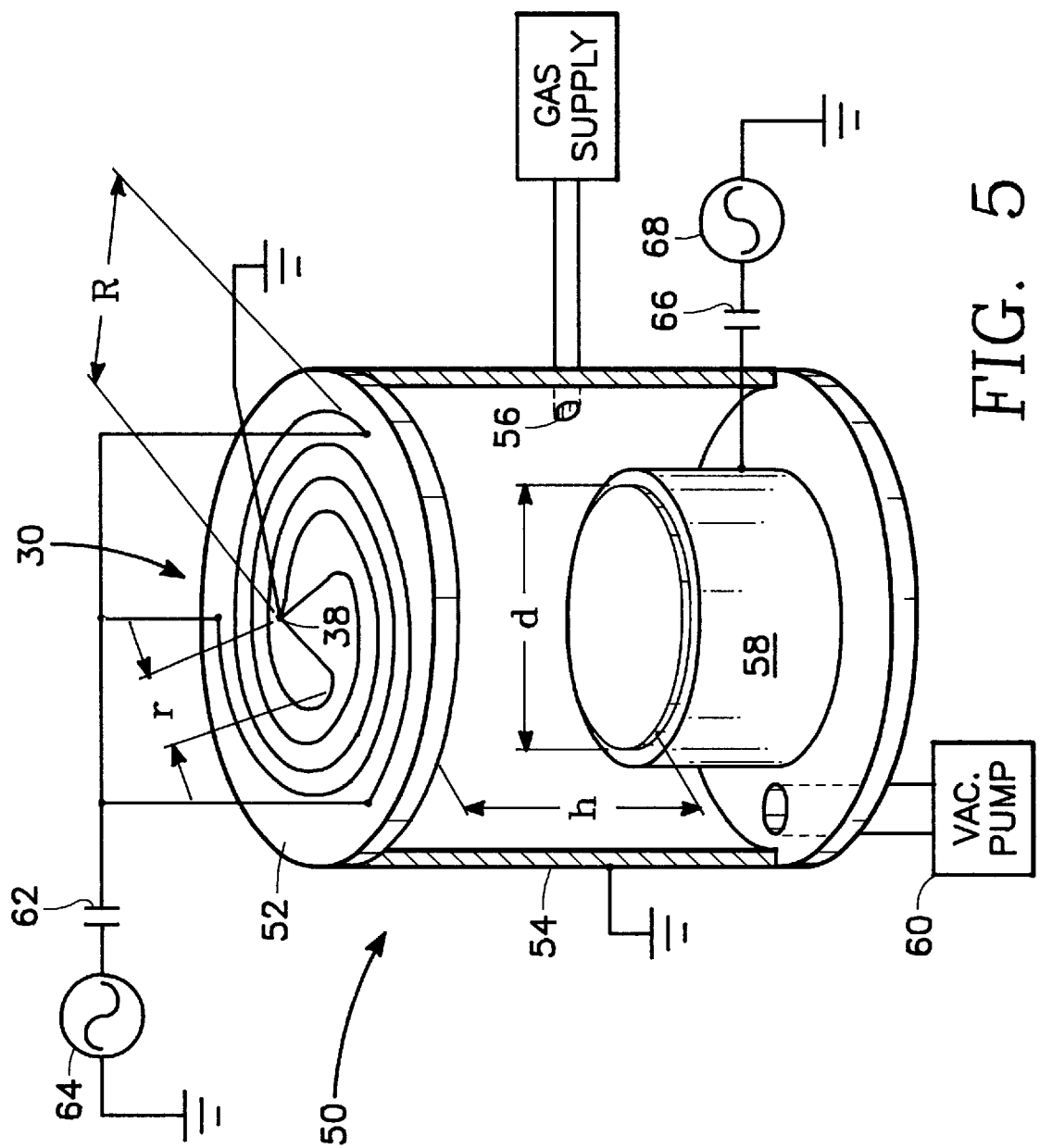
FIG. 5 is a perspective cut-away view of an inductively coupled plasma reactor employing the coiled antenna of the embodiment of FIG. 3A.

FIG. 5 illustrates an inductively coupled plasma reactor including a cylindrical vacuum chamber 50 having a flat disk insulating ceiling 52, a grounded conductive cylindrical side wall 54, a gas supply inlet 56 and a wafer pedestal 58. A vacuum pump 60 pumps gas out of the vacuum chamber. The coil antenna 30 of FIG. 3A rests on the ceiling 52. An RF power source 64 applies power through the capacitor 62 to the outer winding ends 32, 34, 36 while the common terminal 38 is grounded. A bias RF power source 66, 68 is connected to the wafer pedestal 58 to control ion kinetic energy.

In a preferred implementation of the embodiment of FIG. 5, the circular windings become straight radial arms terminating in the apex terminal 38, the arms extending along a radius r (FIG. 5) of about 2.5 cm. The outermost one of the windings 32, 34, 36 has a radius R (FIG. 5) of about 35 cm in those cases in which the wafer diameter d (FIG. 5) is about 20 cm. The height h (FIG. 5) of the coil antenna above the wafer is preferably about 5.0 cm to 7.5 cm. Preferably, each one of the coil windings 32, 34, 36 makes 1.5 turns. The number of windings per length of radius, which in the embodiment of FIG. 5 is $1.5/26 \text{ cm}^{-1}$, may be changed so as to desirably adjust the plasma density distribution across the wafer surface.

Figure 7:
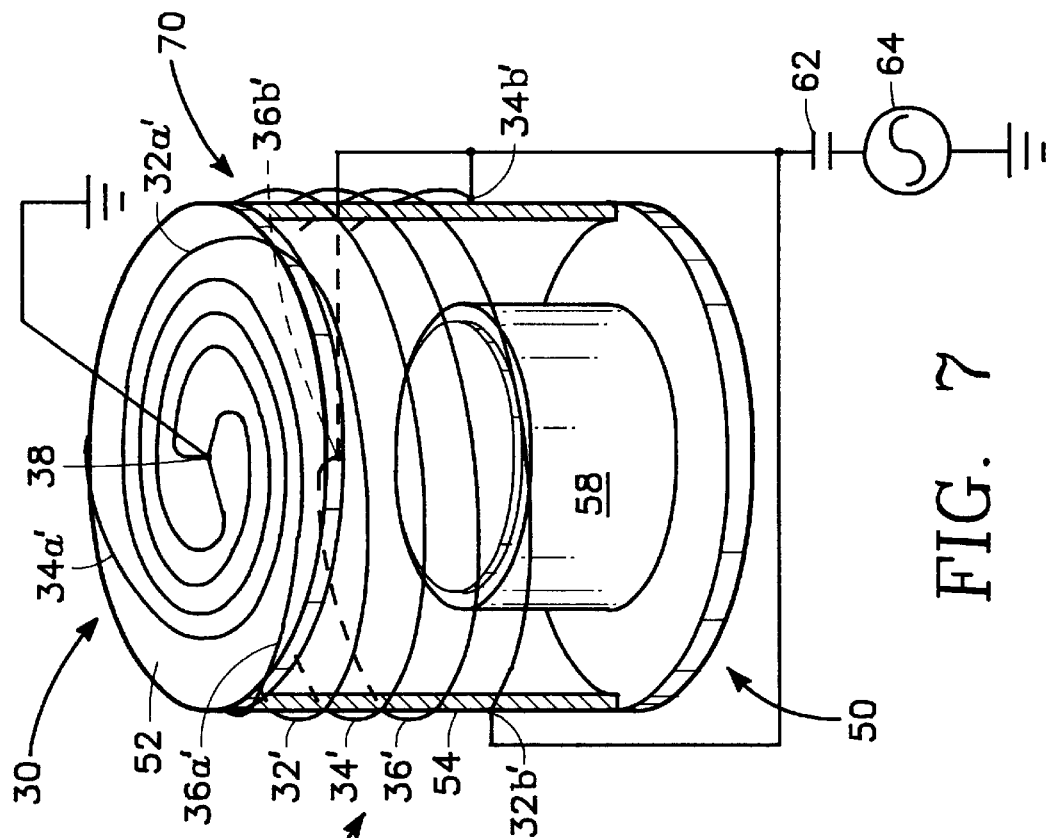
FIG. 7 is a perspective view of a coil antenna in accordance with a third embodiment of the invention which is a variant of the cylindrical coil antenna of FIG. 6 in that the cylindrical coil is continued over the ceiling of the reactor.
Figure 6:
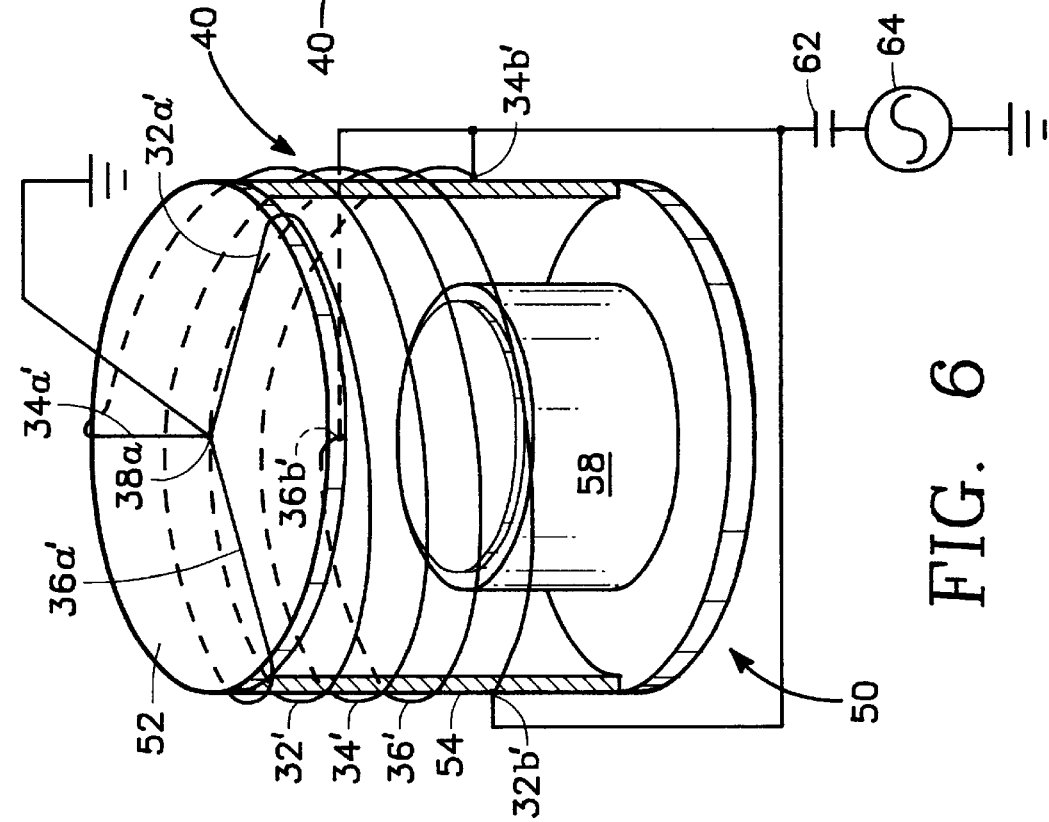
FIG. 6 is a perspective view of a cylindrical coil antenna in accordance with a second embodiment of the invention.
Figures 8, 9:
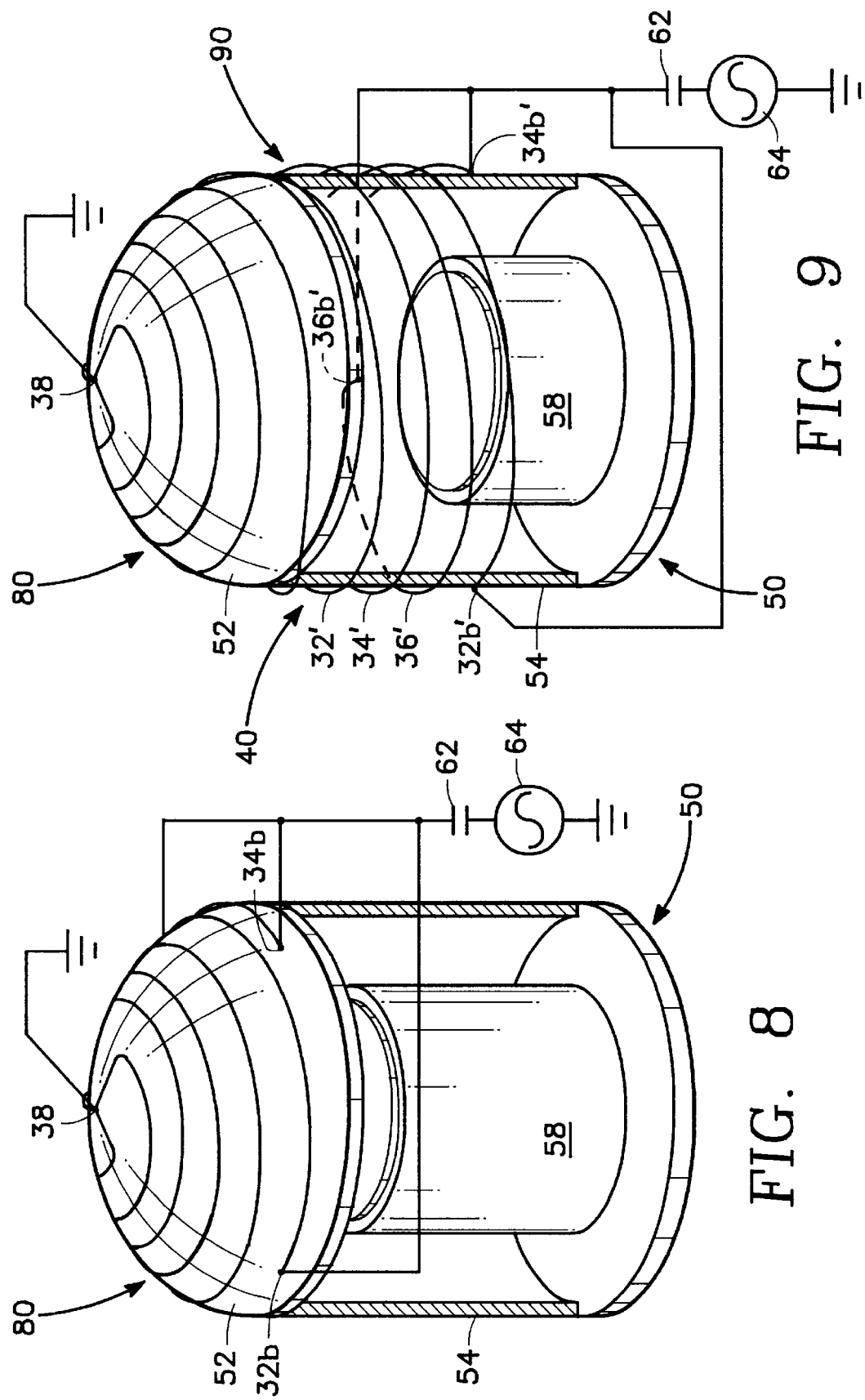
FIG. 8 is a perspective view of a coil antenna in accordance with a fourth embodiment of the invention having a dome shape.
FIG. 9 is a perspective view of a coil antenna in accordance with a fifth embodiment which is a variant of the cylindrical coil antenna of FIG. 6 and the dome antenna of FIG. 8.
Figure 11:
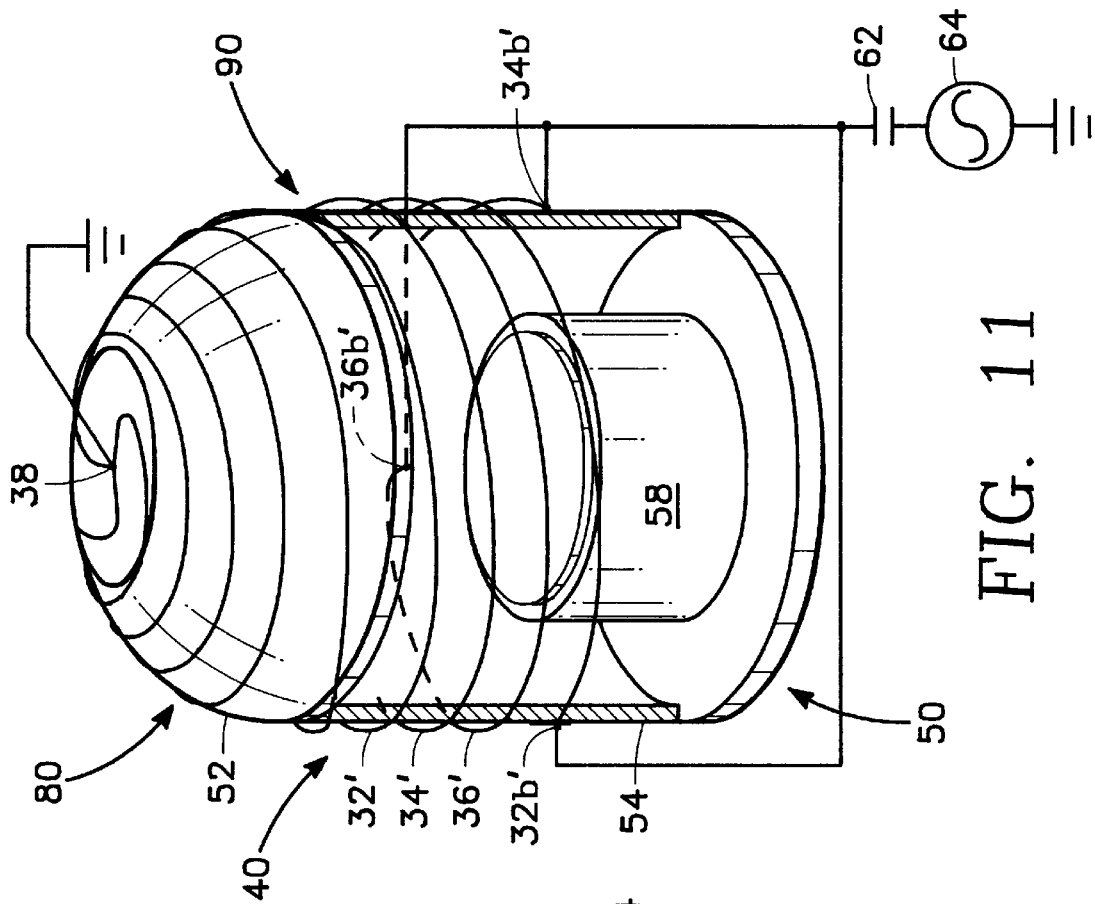
FIG. 11 is a perspective view of a coil antenna in accordance with a seventh embodiment having a truncated dome-shaped portion overlying a truncated dome-shaped reactor ceiling and a cylindrical portion surrounding the reactor side wall.
Figure 10:
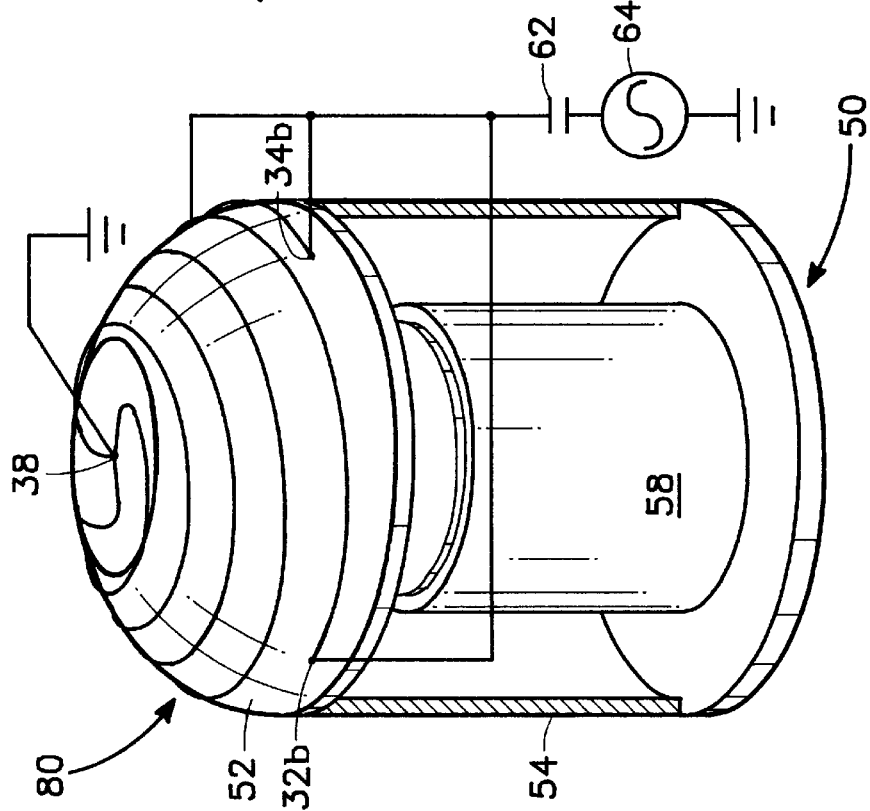
FIG. 10 is a perspective view of a coil antenna in accordance with a sixth embodiment having a truncated dome shape overlying a truncated dome-shaped ceiling of a plasma reactor.

FIG. 6 illustrates a cylindrical version 60 of the coil antenna 30 of FIG. 3A, which also has plural concentric spiral windings 32', 34', 36' each wrapped around an insulating portion of the cylindrical side wall 54 of the reactor of FIG. 5. The plural concentric windings 32', 34', 36' have respective inner ends 32a', 34', 36a' terminating in a common apex terminal 38a, as well as outer ends 32b', 34b', 36b' terminating equidistantly from each other at locations about the lower sidewall of the reactor chamber. FIG. 7 illustrates another version of the cylindrical antenna 60, in which inner ends 32a', 34a', 36a' of the antenna 60 continue in spiral fashion across the top of the reactor in a form much as in FIG. 5 to the common apex terminal 38b, thus forming a continuous single cylindrical coil antenna 70 extending not only over portions of the cylindrical wall 54 but also over the ceiling 52 of the reactor. Preferably, each winding 32', 34', 36' makes a smooth transition at the corner between the ceiling and the cylindrical sidewall, in the manner illustrated in the drawing. FIG. 8 illustrates a dome-shaped version 80 of the coil antenna 30 of FIG. 3A for use with a version of the reactor of FIG. 5 in which the ceiling 52 is dome-shaped. FIG. 9 illustrates how the dome-shaped coil antenna 80 may be integrated with the cylindrical shaped coil antenna 60 to form a single antenna 90 covering both the dome-shaped ceiling and cylindrical side wall of the reactor of the embodiment of FIG. 8. The windings make a smooth transition from the dome-shaped ceiling to the cylindrical sidewall in the manner illustrated in the drawing. FIG. 10 illustrates a modification of the coil 80 of FIG. 8 in which the dome-shaped ceiling is truncated so as to have a flattened apex. FIG. 11 illustrates a modification of the coil of FIG. 9 in which the dome-shaped ceiling is truncated so as to have a flattened apex.

The windings 32, 34, 36 are spaced from one another by a sufficient spacing to prevent arcing therebetween. In order to provide an azimuthal symmetrical RF power feeding and minimum potential difference between adjacent winding along the entire lengths thereof, all windings 32, 34, 36 preferably are of the same length. In the illustrated embodiments, the spacings between windings are equal and are uniform throughout the antenna coil,. However, the invention may be modified by varying the winding-to-winding spacings so as to be different at different locations or to differ as between different pairs of windings.

While the invention has been described with reference to preferred embodiments having three concentric spiral windings 32, 34, 36, other embodiments of the invention may be made with any desired number of windings, provided the requisite winding-to-winding spacing is maintained to avoid arcing. A greater number of spiral windings provides a more uniform RF field and in some cases more uniform plasma ion density across the wafer surface.

FIG. 12 illustrates a variation of the embodiment of FIG. 10 in which the ceiling 52 has a central flat region 52a surrounded by an annular chamfer 52b which provides a smooth transition from the horizontal flat region 52a to the vertical side wall 54. This in turn helps the windings 32, 33, 34, 35, 36 make a smooth transition as well. An annular portion of the coil antenna overlies and conforms with the corner chamfer. Furthermore, the embodiment of FIG. 12 has five concentric windings 32, 33, 34, 35, 36 with outer ends 32b, 33b, 34b, 35b, 36. FIG. 13 illustrates a variation of the embodiment of FIG. 12 in which concentric windings 32', 33', 34', 35', 36' make a smooth transition at the corner chamfer from the flat portion of the ceiling 52 to the cylindrical side wall, each of these windings including a first portion overlying the flattened central part 52a of the ceiling 52, a second portion overlying the corner chamfer 52b of the ceiling 52 and a third portion wrapped around the cylindrical side wall 54. The winding outer ends 32b', 33b', 34b', 35b', 36b' defining the bottom of the coil antenna are disposed at about the same height as the top of the wafer pedestal 58 and are connected to the output terminal of the RF source through the capacitor 62.

FIG. 14 illustrates a variation of the embodiment of FIG. 12 having flattened dome-shaped ceiling, whose arc subtends an angle substantially less than 180 degrees, for example about 90 degrees. In contrast, for example, the dome-shaped ceiling of FIG. 10 subtends approximately 180 degrees of arc. FIG. 15 illustrates a variation of the embodiment of FIG. 13 also having flattened dome-shaped ceiling, whose arc subtends an angle substantially less than 180 degrees, for example about 90 degrees.

FIG. 16 illustrates an embodiment combining a flattened central dome 52a' like that of FIG. 14 with an outer corner chamfer 52b' like that of FIG. 12. FIG. 17 illustrates a variation of the embodiment of FIG. 16 in which the windings make a smooth transition at the corner chamfer 52b from the ceiling 52 to the cylindrical side wall 54. The embodiments of FIGS. 12–17 are illustrated as having 5 concentric windings each, in contrast with the 3 concentric windings of the embodiments of FIGS. 3–11. The invention can be implemented with any suitable number of concentric windings.

Advantages of the Invention

The parallel arrangement of the windings 32, 34, 36 of the coil antenna 30 of FIG. 3A reduces the potential across each winding, as compared to, for example, using only one winding, and therefore reduces the capacitive coupling (as explained above with reference to FIG. 2). In addition, the coil antenna of FIG. 3A provides uniform plasma density over the wafer, as compared previous techniques for example, as there are no discontinuities of the type discussed above with reference to FIG. 2. Further, as compared to FIG. 1, not only is the potential across each winding reduced, but also the current flowing in the parallel windings of the invention is spatially distributed over the reaction volume in a much more uniform fashion.

Preferably, each of the windings 32, 34, 36 have the same length and their outer ends 32b, 34b, 36b terminate at points equidistant from each other about a circularly symmetric reaction chamber, further enhancing uniformity. Preferably, the winding inner ends 32a, 34a, 36a terminate at the geometric center of the coil antenna because the apex is located at the geometric center of the coil, which preferably has geometric circular symmetry. Preferably also, this geometric antenna center is made to coincide with the axis of symmetry of a circularly symmetric reactor chamber. Also, the winding inner ends 32, 34a, 36a are spaced equidistantly away from each other for a limited radial distance as they approach the apex terminal 38a. Further, the windings are spaced from each other as uniformly as possible at least in flat configurations of the invention such as the embodiment of FIG. 3A; while in non-flat configurations such as the embodiment of FIG. 8, smoother variations and spacings with radius from the geometrical center may be made to compensate for chamber geometry.

Figure 1:
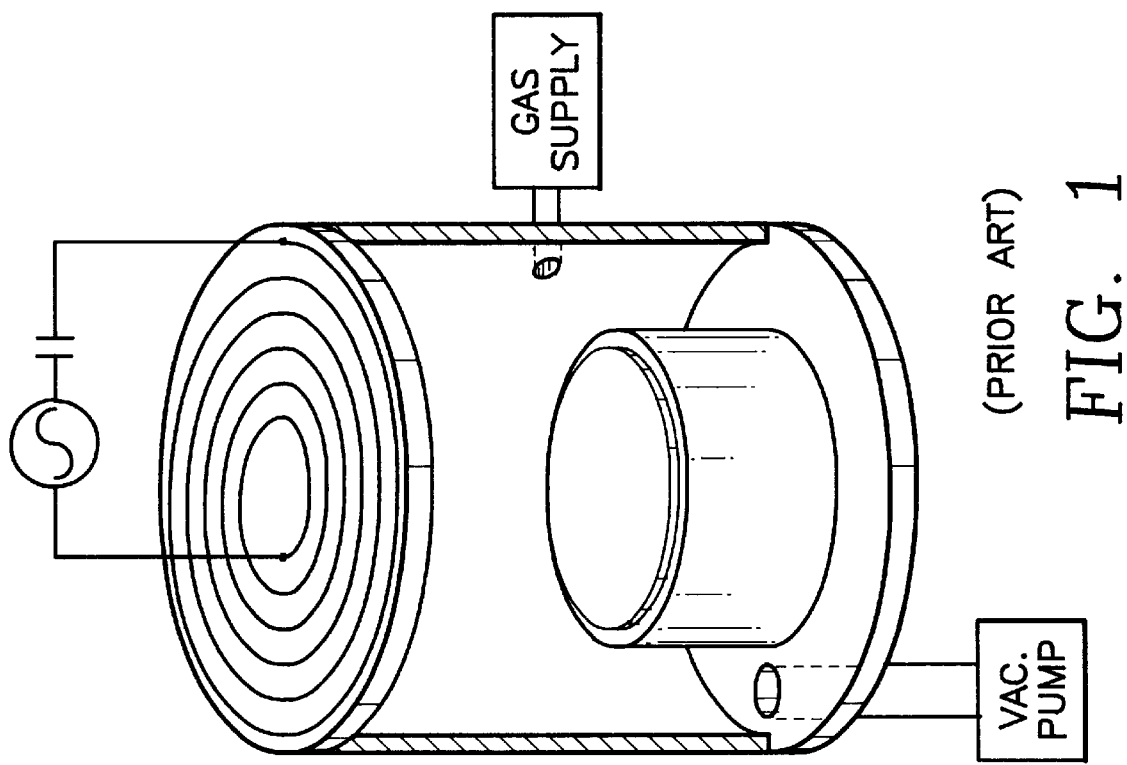
FIG. 1 is a simplified diagram of a coiled antenna for an inductively coupled plasma reactor of the prior art.

As a result, the RF power applied to the coil antenna of FIG. 3A need not be limited as in the case of the coil antenna of FIG. 1. Indeed, the coil antenna of FIG. 3A can operate with 3000 Watts of RF power at 13.56 MHz, while the coil antenna of FIG. 1 must be limited to about 300 watts to prevent failures due to the non-uniform field coverage. The increase in RF power afforded by the coil antenna of FIG. 3A provides higher etch rates in a plasma etch reactor, higher deposition rates in a chemical vapor deposition reactor, and so forth. Thus, the invention not only provides greater processing uniformity across the wafer surface but also provides greater throughput or productivity.

Figure 18:
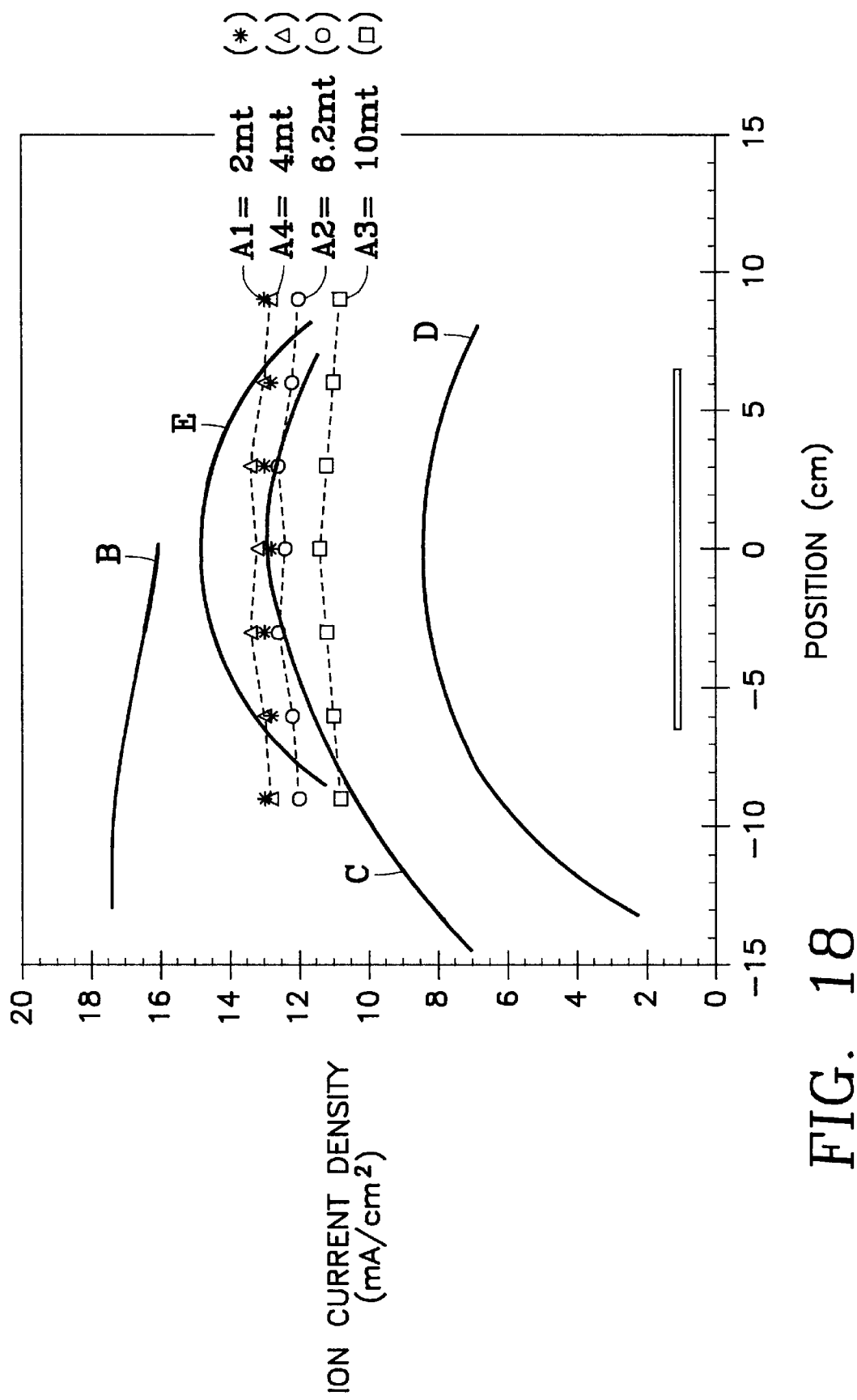
FIG. 18 contains superimposed graphs of ion current measured at the wafer surface as a function of radial position from the wafer center for various types of reactors of the prior art and corresponding graphs for a reactor incorporating the present invention.

The invention provides a greater uniformity of ion density across the wafer surface, a significant advantage. This is illustrated in the superimposed graphs of FIG. 18. The curves in FIG. 18 labelled A1, A2, A3 and A4 represent measurements of ion current at the wafer surface in milli-Amperes per square centimeter as a function of distance from the wafer center in centimeters for a reactor employing the coil antenna of the invention depicted in FIG. 3A with a reactor chamber supplied with chlorine gas at an applied RF power level of 2000 Watts on the antenna coil, no RF bias power applied and the chamber maintained at a pressure of 2 milliTorr, 6.2 milliTorr, 10 milliTorr and 4 milliTorr, respectively. The smallest deviation in ion density, namely 2% in the curve labelled A1, is obtained at 2 milliTorr. The uniformity percentage represents the change in current density (vertical axis) across the wafer divided by two times the average current density in that range. In contrast, a reactor sold by manufacturer #1, whose performance is depicted by the curve labelled B in FIG. 18, had a deviation in plasma ion density of 4.5% across the wafer surface at the same applied RF power level and no RF bias power applied and a mixture of 50 parts of chlorine and 20 parts helium. A reactor sold by manufacturer #2, whose performance is depicted by the curve labelled C in FIG. 18, had a deviation in plasma ion density of 9% under similar conditions. A reactor sold by manufacturer #3, whose performance is depicted by the curve labelled D in FIG. 18 had a deviation of 11% in plasma ion density across the wafer surface. A reactor sold by manufacturer #4, whose performance is depicted by the curve labelled E in FIG. 18, had a deviation in plasma ion density across the wafer surface of 26% at an applied power level of 900 Watts on the antenna coil. The foregoing data is summarized in the following table:

TABLE I

| Plasma Reactor | Ion Current (mA/cm$^2$) | Applied Power (Watts) | Pressure (mTorr) | Gas | Ion Density Deviation |
|---|---|---|---|---|---|
| Invention | 12.8 | 2000 | 2 | Cl | 2% |
| mfg'r #1 | 17 | 2000 | 1.2 | 50Cl/20He | 4.5% |
| mfg'r #2 | 11.4 | 2000 | 2 | Cl | 9% |
| mfg'r #3 | 7.6 | 1450 | 2 | Cl | 11% |
| mfg'r #4 | 11.5 | 900 | 5 | Cl | 26% |

Figure 19:
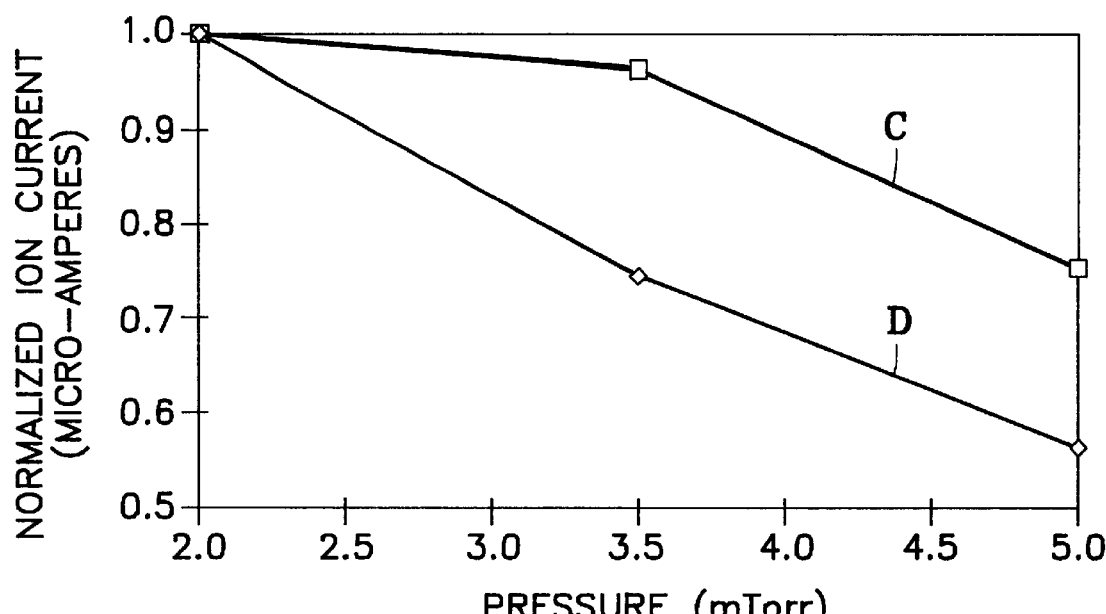
FIG. 19 contains superimposed graphs of ion current measured at the wafer surface as a function of reactor chamber pressure for different reactors of the prior art.
Figure 20:
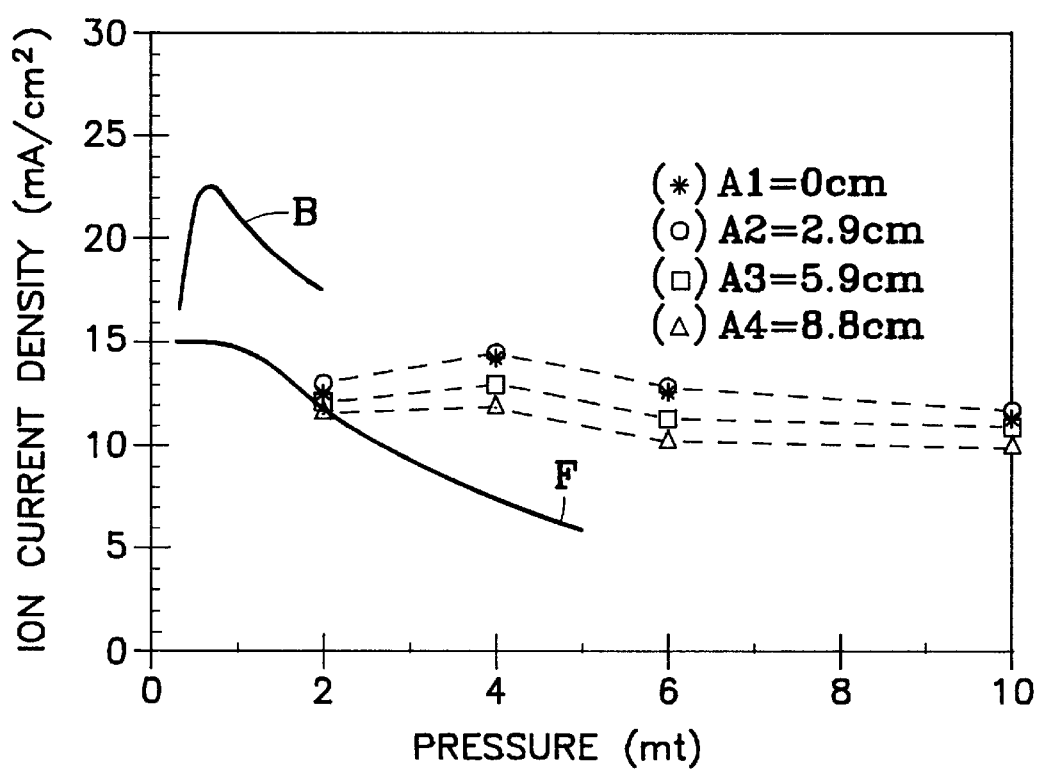
FIG. 20 contains superimposed graphs of ion current measured at the wafer surface as a function of reactor chamber pressure for different reactors of the prior art and corresponding graphs for a reactor incorporating the present invention.
Figure 21:
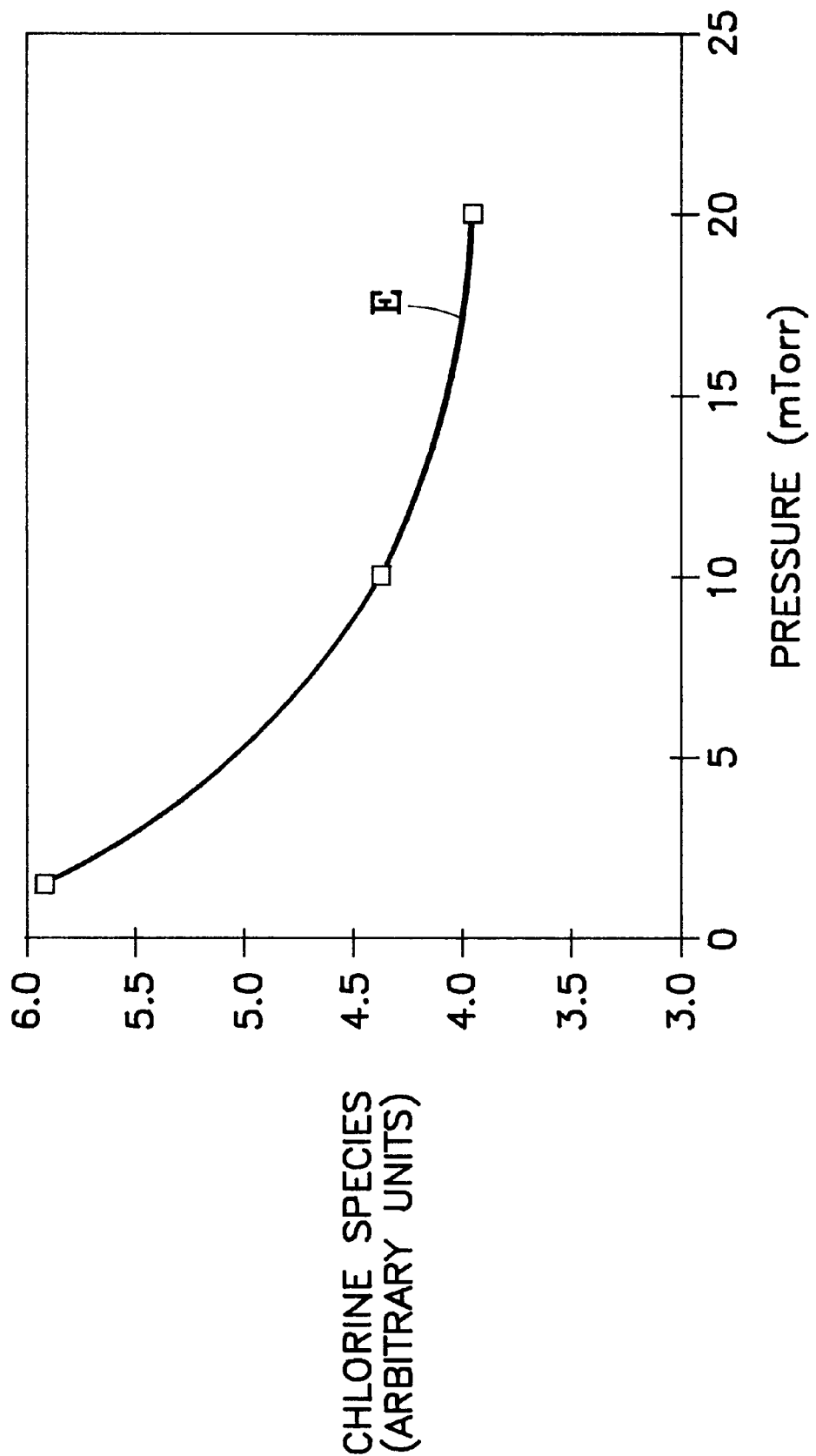
FIG. 21 contains superimposed graphs of ion current measured at the wafer surface as a function of reactor chamber pressure for different reactors of the prior art.

The invention provides a greater stability of ion density over a large range of chamber pressures, a significant advantage. The performance of two plasma reactors of the prior art sold by manufacturers #2 and #3 are depicted by the superimposed curves labelled C and D, respectively, in FIG. 19. The vertical axis is a normalized measured ion current at the wafer surface while the horizontal axis is the chamber pressure in milliTorr. The manufacturer #2 reactor (curve C) has a deviation of 23% in ion current over a pressure range from 2 to 5 milliTorr. The manufacturer #3 reactor (curve D) has a deviation of 40% in ion current over the same pressure range. The performance of the invention in accordance with FIG. 3A and of other prior art reactors is depicted in the superimposed graphs of FIG. 20. The curves labelled A1, A2, A3 and A4 depict the ion current measured at the wafer surface in the reactor of the invention at distances of 0 cm, 2.9 cm, 5.9 cm and 8.8 cm, respectively, from the wafer center. These curves show that the deviation in ion density using a reactor of the invention is no more than 10% across the same pressure range. The reactor sold by manufacturer #1, whose performance is depicted by the curve labelled B in FIG. 20, had a deviation of 22% across a much narrower pressure range. A reactor sold by manufacturer #5, whose performance is depicted by the curve labelled F in FIG. 20, had a deviation in ion density of 45 across a similar pressure range (2–5 milliTorr). The reactor sold by manufacturer #4, whose performance is depicted by the curve labelled E in FIG. 21, had a deviation in ion density of 25% across the narrower pressure range of 0.5 to 2.0 milliTorr. The foregoing experimental measurements relating to stability of ion density over change in chamber pressure are summarized in the following table:

TABLE II

| Plasma Reactor | Ion Current (mA/cm$^2$) | Applied Power (Watts) | Pressure (mTorr) | Gas | Ion Density Deviation |
|---|---|---|---|---|---|
| Invention | 10 | 2000 | 2–10 | Cl | 10% |
| mfg'r #1 | 17 | 2000 | .7–2 | 50Cl/20He | 22% |
| mfg'r #2 | 11.4 | 2500 | 2–5 | Cl | 23% |
| mfg'r #3 | 7.6 | 1000 | 2–5 | Cl | 40% |

TABLE II-continued

| Plasma Reactor | Ion Current (mA/cm²) | Applied Power (Watts) | Pressure (mTorr) | Gas | Ion Density Deviation |
|---|---|---|---|---|---|
| mfg'r #4 | 11.5 | 300 W (source) 30 W (bias) | 2–10 | Cl | 25% |
| mfg'r #5 | 15 | 1000 | 2–5 | N | 45% |

The foregoing experimental data show that the invention provides a stability in ion density over changes in pressure over twice that of the best reactors of the prior art and at least four times that of other reactors of the prior art.

Figure 22:
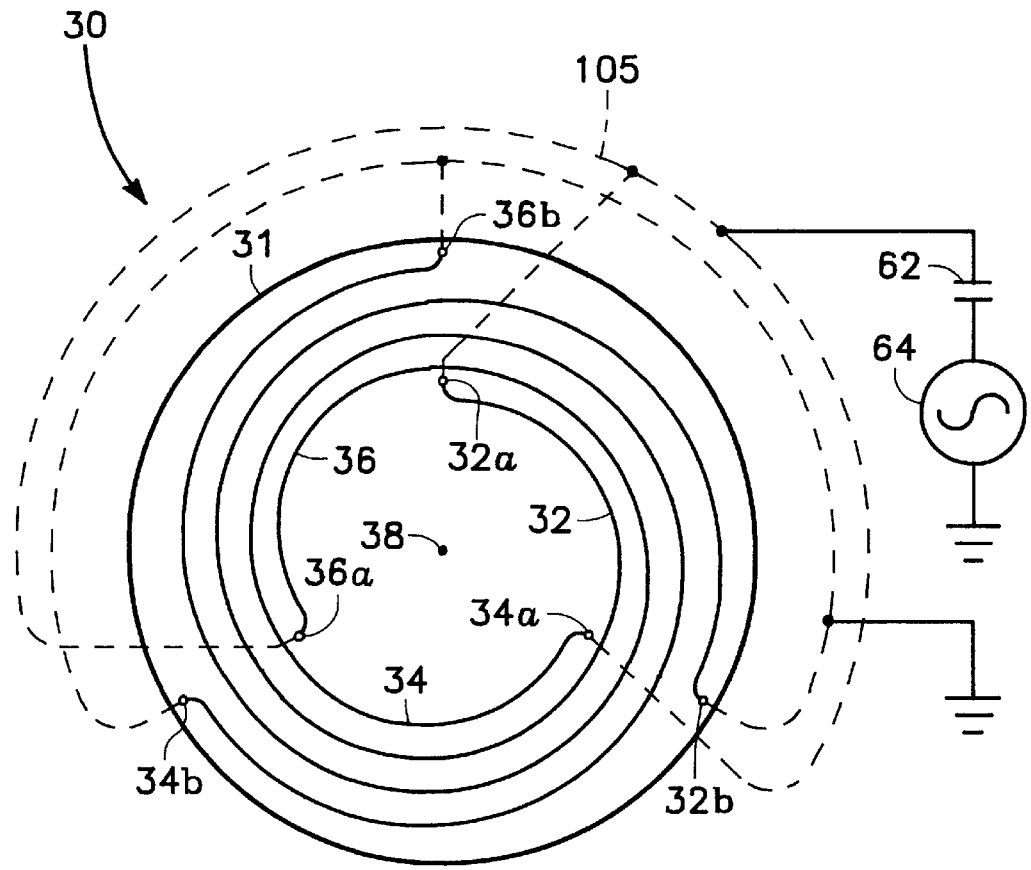
FIG. 22 is a schematic diagram illustrating a concentric multiple spiral coil having its inner ends connected radially outwardly to a conductor bus.

Referring to FIG. 22, the multiple spiral coil of FIG. 3A is modified so that the interior winding ends 32a, 34a, 36a are connected radially outwardly to a common bus 105, thus eliminating the apex terminal 38. While the RF power source 64 and matching element 62 can be connected to the outer winding ends 32b, 34b, 36b as shown in FIG. 3A, in accordance with another modification illustrated in FIG. 22, the power source 64 and matching element 62 can be connected, instead, to the interior winding ends 32a, 34a, 36a, the exterior winding ends 32b, 34b, 36b being grounded or connected to an RF common return.

Figure 23:
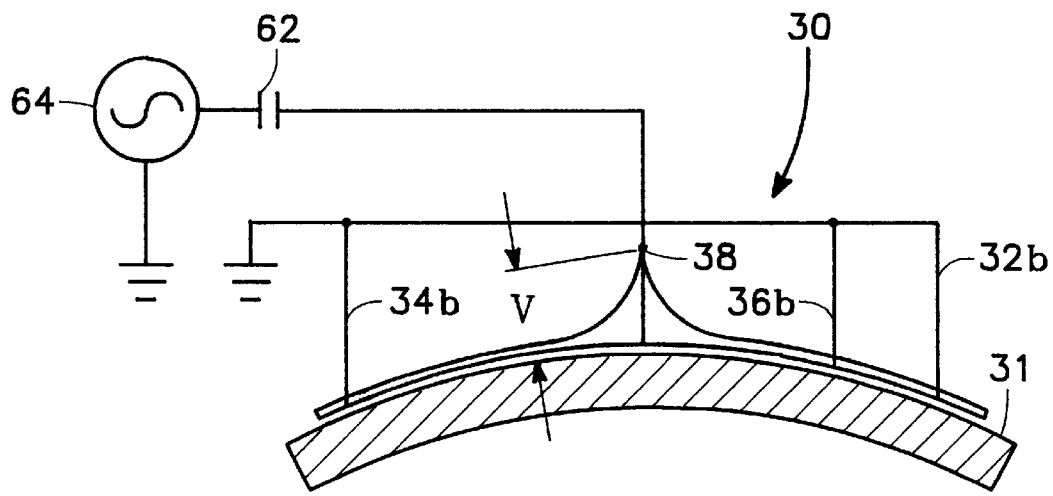
FIG. 23 is a side view of a dome shaped concentric multiple spiral coil having an upward wick toward an apex termination.
Figure 24:
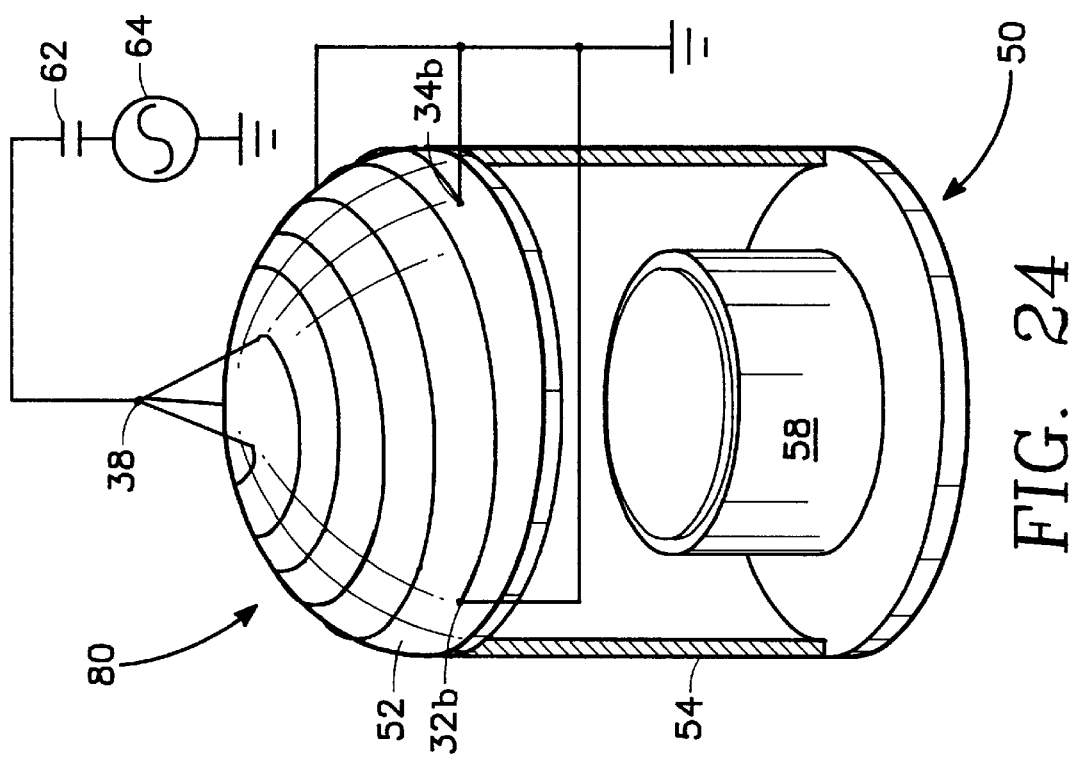
FIG. 24 illustrates a dome shaped multiple spiral concentric coil powered at its inner apex terminal.

FIGS. 23 and 24 illustrate how the vertically upward wicking of the inner arms of the windings 32, 34, 36 toward the apex terminal 38 previously described with reference to FIG. 4 can be combined with a dome shaped ceiling and multiple spiral coil conformal therewith. Referring to FIG. 5, the upward wicking enhances the central opening of radius r in the multiple spiral coil formed by the radial arms radiating from the apex terminal 38. Such an opening provides a way of adjusting the radial distribution of plasma density across the surface of the wafer 16. Specifically, an overhead coil configuration without such a central opening tends to produce a nonuniform radial distribution of plasma density across the wafer surface having a pronounced peak over the wafer center. The or eliminates that peak, depending upon the radius r and upon the magnitude of the RF plasma source power applied to the overhead coil windings 32, 34, 36. The RF plasma source power may be applied to the outer winding ends (as discussed previously with reference to FIG. 4) or to the apex terminal 38 as illustrated in FIGS. 23 and 24.

Figure 25:
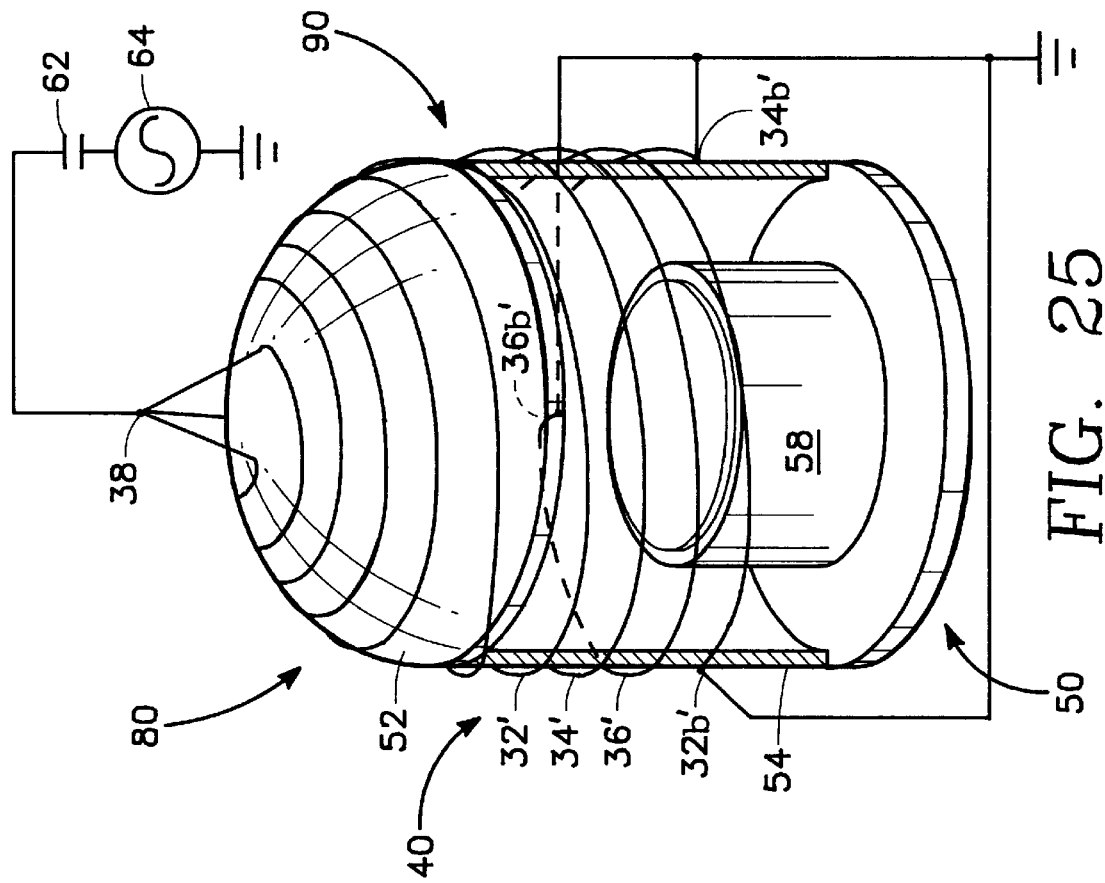
FIG. 25 illustrates a dome shaped multiple spiral concentric coil powered at its inner apex terminal, in which the coil extends downwardly along the chamber cylindrical side wall.

FIG. 25 illustrates an embodiment corresponding to FIG. 24 in which the overhead multispiral windings 32, 34, 36 continue as cylindrical side windings 32', 34', 36' down the cylindrical side wall 54 of the chamber.

FIG. 26 illustrates an embodiment of the invention having no overhead conductors (i.e., no conductors overlying the ceiling 52) whatsoever, and having only the cylindrical multispiral side windings 32', 34', 36'. In the embodiment of FIG. 26, the apex terminal has been eliminated and instead the top ends 32a', 34a', 36a' of the windings 32', 34', 36' are, instead, connected radially outwardly to a common bus 105. While the top ends 32a', 34a', 36a' may be grounded and RF power applied to the bottom ends 32b', 34b', 36b' (as in FIG. 6), FIG. 26 illustrates how the RF power may be applied, instead, to the top ends 32a', 34a', 36a' while the bottom ends 32b', 34b', 36b' are grounded. Since in FIG. 26 there are no overhead conductors (i.e., conductors overlying the ceiling 52), the ceiling 52 may be of any suitable shape without affecting the multispiral coil, including the flat shape illustrated in FIG. 26 as well as dome shaped or truncated conical and so forth.

FIG. 27 illustrates an embodiment corresponding to that of FIG. 9 but having, instead, a flat ceiling and the portion of the multiple spiral coil overlying the ceiling conforming with the ceiling shape.

FIG. 28 illustrates an embodiment corresponding to FIG. 24 but having a truncated or flat center portion in its dome ceiling. FIG. 29 illustrates an embodiment corresponding to that of FIG. 25 but having a truncated or flat center portion in its dome ceiling. In either one of the embodiments of FIGS. 28 and 29, the top or center ends of the windings 32, 34, 36 may be connected radially inwardly to the apex terminal 38 (as illustrated in FIG. 28) or radially outwardly to the bus 105 (as illustrated in FIG. 29). In either one of the embodiments of FIGS. 28 and 29, the apex 38 or bus 105 may be grounded or (as illustrated in FIGS. 28 and 29) may be connected to the RF power source.

FIG. 30 illustrates how a multiple spiral coil overlying the ceiling 52 can be divided radially into two multiple spiral coils, namely a radially inner multiple spiral coil 110 and a radially outward multiple spiral coil 115. The RF power applied to each one of the two multiple spiral coils 110, 115 is controlled independently so that different RF power levels can be applied to the two coils 110, 115. The advantage is that such a feature permits greater control or adjustment of the radial distribution of plasma density over the wafer surface. Specifically, for example, the radial distribution of plasma ion density across the surface of the wafer 16 is maximum near the center and minimum near the edge, then the RF power applied to the inner coil 110 can be reduced relative to that applied to the outer coil 115 in order to reduce the nonuniformity between plasma density at the center relative to the edge, thereby rendering the radial distribution of plasma ion density more uniform.

In the embodiment of FIG. 30, each one of the multiple spiral coils (the inner coil 110 and the outer coil 115) consists of three concentric spiral conductor windings as follows: the inner multiple spiral coil has concentric spiral windings 111, 112, 113 with radially inner terminations 111a, 112a, 111a and radially outer terminations 111b, 112b, 113b; the outer multiple spiral coil 115 has concentric spiral windings 116, 117, 118 with radially inner terminations 116a, 117a, 118a and radially outer terminations 116b, 117b, 118b. In the case of each winding, one of its inner and outer terminations is grounded while the other is connected to one of two independently adjustable RF power sources 120, 125. The power source 120 drives the inner coil 110 while the power source 125 drives the outer coil 115. For example, if all the outer terminations of the inner and outer coils 110, 115 are to be grounded, then the inner ends 111a, 112a, 113a are connected to the power source 120 while the inner ends 116a, 117a, 118a are connected to the power source 125, as illustrated in FIG. 30.

FIG. 31 illustrates how a multiple spiral coil covering both the ceiling and side wall of the chamber can be divided into two separate coils, namely an overhead multiple spiral coil 130 covering the chamber ceiling and a side multiple spiral coil 135 covering the chamber side wall. Each coil 130, 135 is separately driven by RF power sources 120, 125. Like the embodiment of FIG. 30, the two separate coils affect plasma density in different radial zones over the wafer 18, the overhead coil 130 predominantly affecting plasma density over the center and the side coil 135 predominantly affecting plasma density over the circumferential edge of the wafer 18. Thus, driving the two coils 130, 135 independently provides a way of adjusting or optimizing the radial distribution of the plasma density across the wafer surface, with the advantages discussed above relative to the embodiment of FIG. 30.

While many implementations of the concept illustrated in FIG. 31 are possible, in the implementation depicted in the drawing, the overhead coil 130 has three concentric spiral conductors 131, 132, 133 (generally horizontally offset from one another) having radially inner terminations 131a, 132a, 133a and radially outer terminations 131b, 132b, 133b, while the side coil 135 has three concentric spiral conductors (vertically offset from one another) 136, 137, 138 with inner terminations 136a, 137a, 130a and outer terminations 136b, 137b, 133b. For each individual spiral conductor, if one of its inner and outer terminations is to be grounded, then the other is connected to the corresponding one of the two RF power sources 120, 125. For example, if all the outer terminations are to be grounded, then the RF power source 120 is connected to the inner terminations 131a, 132a, 133a while the power source 125 is connected to the inner terminations 136a, 137a, 138a, as illustrated in the drawing.

Figure 33:
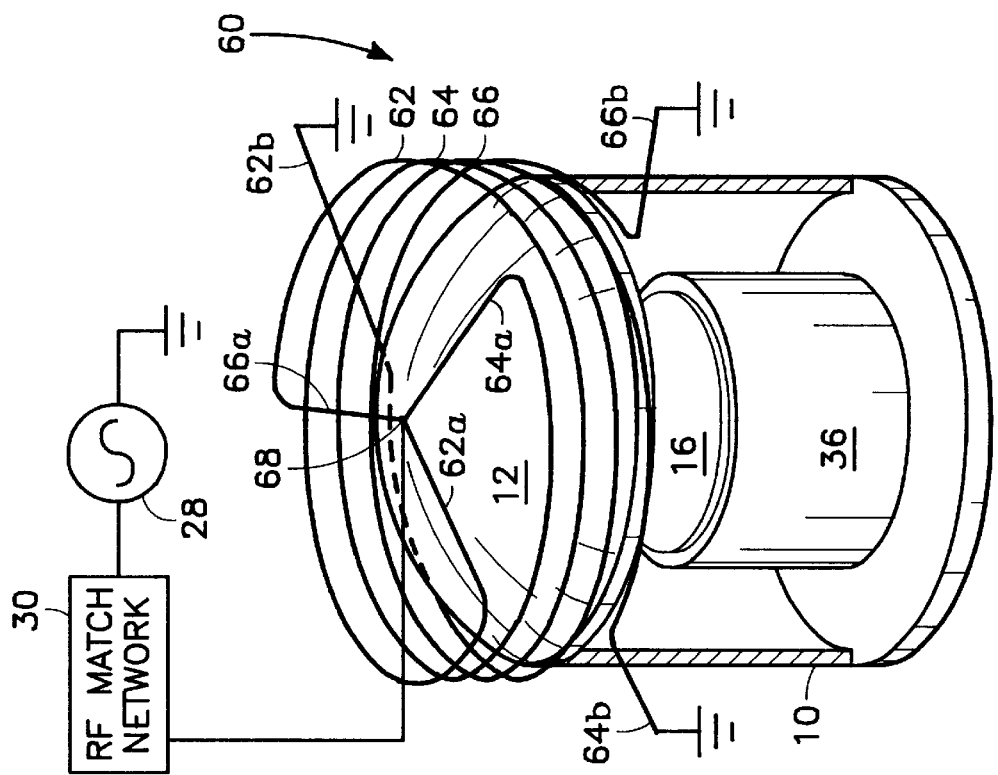
FIG. 33 illustrates an embodiment corresponding to FIG. 32 in which the radially inner ends of each winding terminate in a central apex termination.
Figure 32:
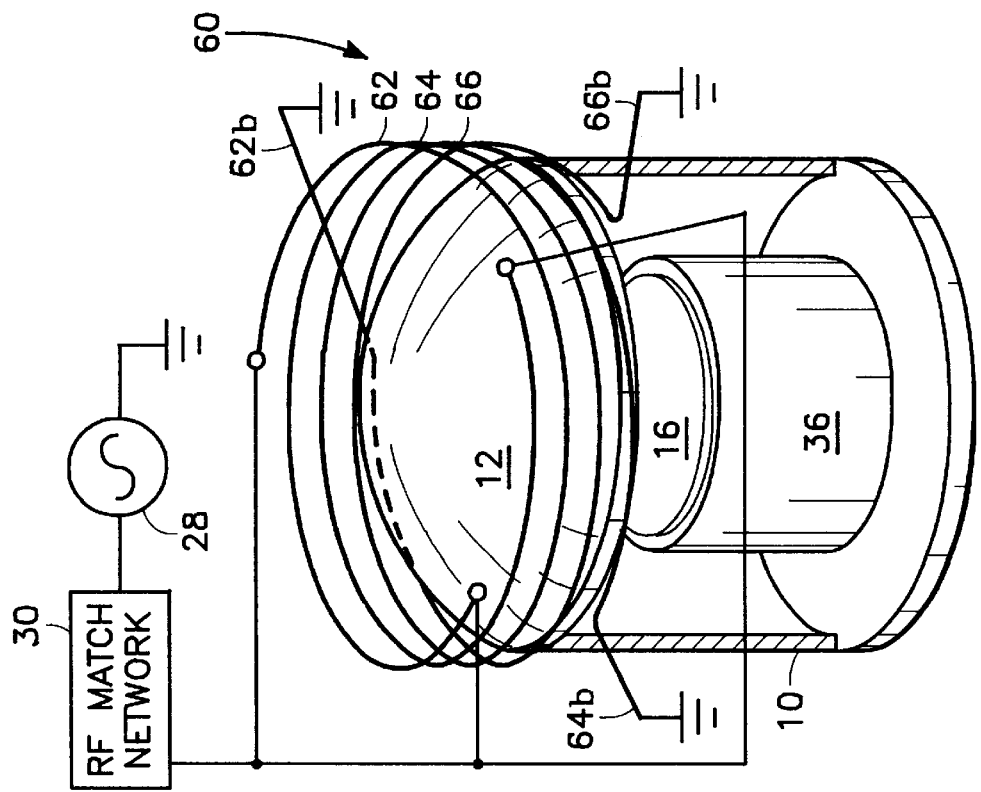
FIG. 32 illustrates a cylindrical concentric multiple spiral coil nonconformal with a dome shaped ceiling and devoid of any conductors over the ceiling.

While the embodiments discussed above relative to FIGS. 3A through 31 were described with reference to multiple spiral coils with shapes generally conforming to the shape of the underlying chamber ceiling or side wall, such conformity is not necessarily required, and in fact various embodiments of the invention contemplate multiple spiral concentric coils with shapes nonconformal relative to the shape of the underlying chamber surface (ceiling or sidewall). Referring to FIGS. 32 and 33, a generally cylindrically shaped multiple spiral coil 140, consisting of three concentric spiral windings 141, 142, 143, is juxtaposed adjacent a dome shaped ceiling. In FIG. 32, the inner terminations 141a, 142a, 143a of the windings 141, 142, 143 are connected radially outwardly to a common bus 105 which in turn is connected to the RF power supply 164. The outer terminations 141b, 142b, 143b are grounded, although the polarity may be reversed with the inner terminations grounded and the outer termination connected to the RF power supply 164. One advantageous feature of FIG. 32 is that the radially outward connections of the winding inner terminations to the bus 105 eliminates all conductors that otherwise would overlie the chamber ceiling. The embodiment of FIG. 33 differs in this respect in that the winding inner termination are connected radially inwardly to the apex termination 38, so that some conductor paths overlie the chamber ceiling.

Figure 34:
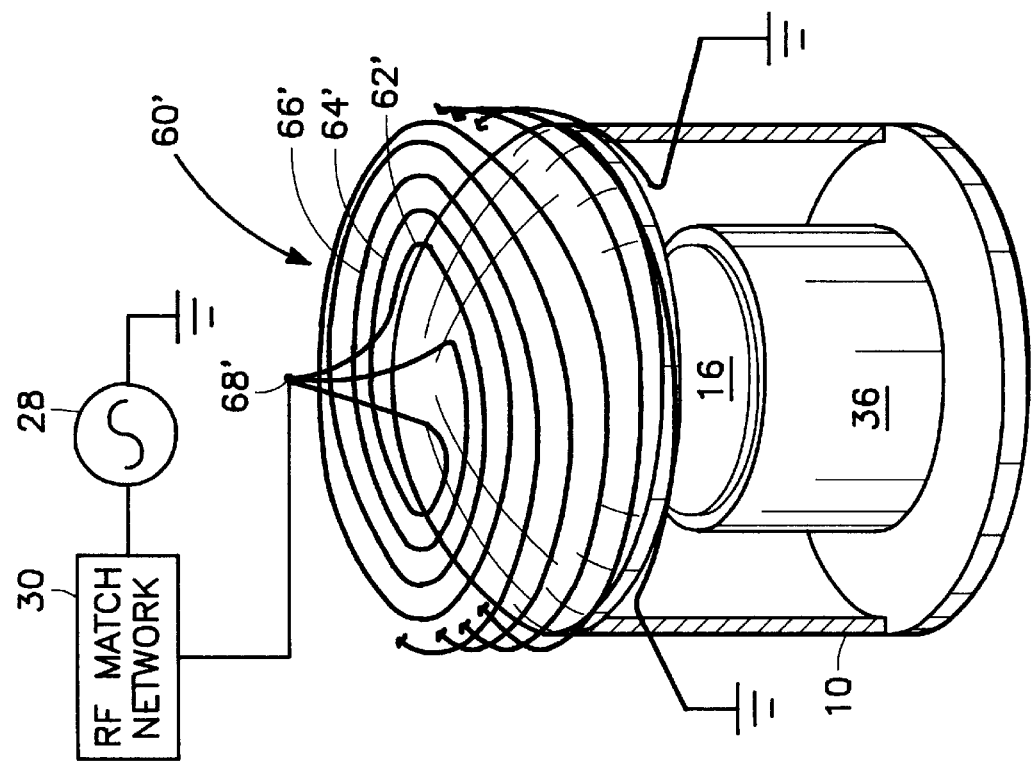
FIG. 34 illustrates an embodiment corresponding to FIG. 33 and having in addition a cylindrical concentric multiple spiral coil.

FIG. 34 illustrates an embodiment corresponding to that of FIG. 33 but further including an overhead multiple spiral coil 150 directly overlying the ceiling. The overhead multiple spiral coil 150 may be flat and overlie a dome shaped ceiling (as illustrated in the drawing) or itself may be dome shaped or another suitable shape. The cylindrical shaped side coil 140 and the overhead coil 150 may be electrically connected together to the same RF power source or may be electrically separate coils and driven independently by different RF power sources as in the embodiment of FIG. 31. Furthermore, each one of the nonconformal multiple spiral coils of FIGS. 32–34 itself may be divided into separately driven inner and outer coils, as in the embodiment of FIG. 30.

Figure 35:
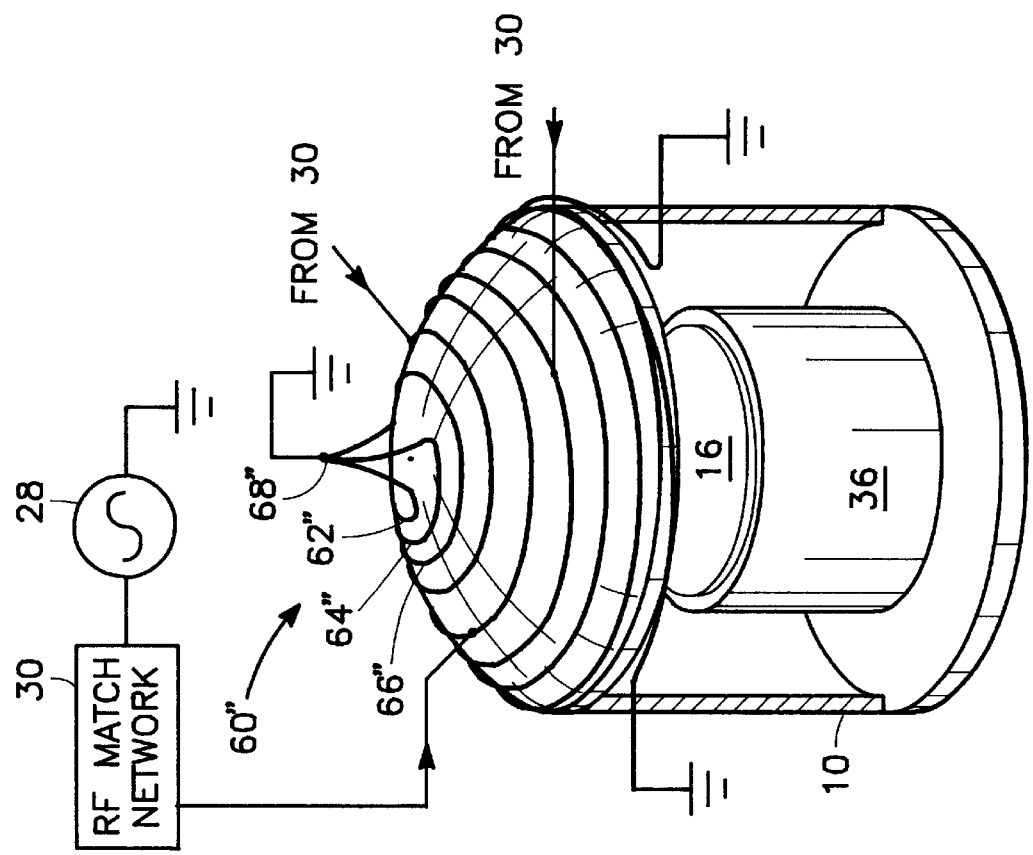
FIG. 35 illustrates an embodiment in which RF power is applied to an intermediate point along each of the concentric spiral windings of the coil.
Figure 36:
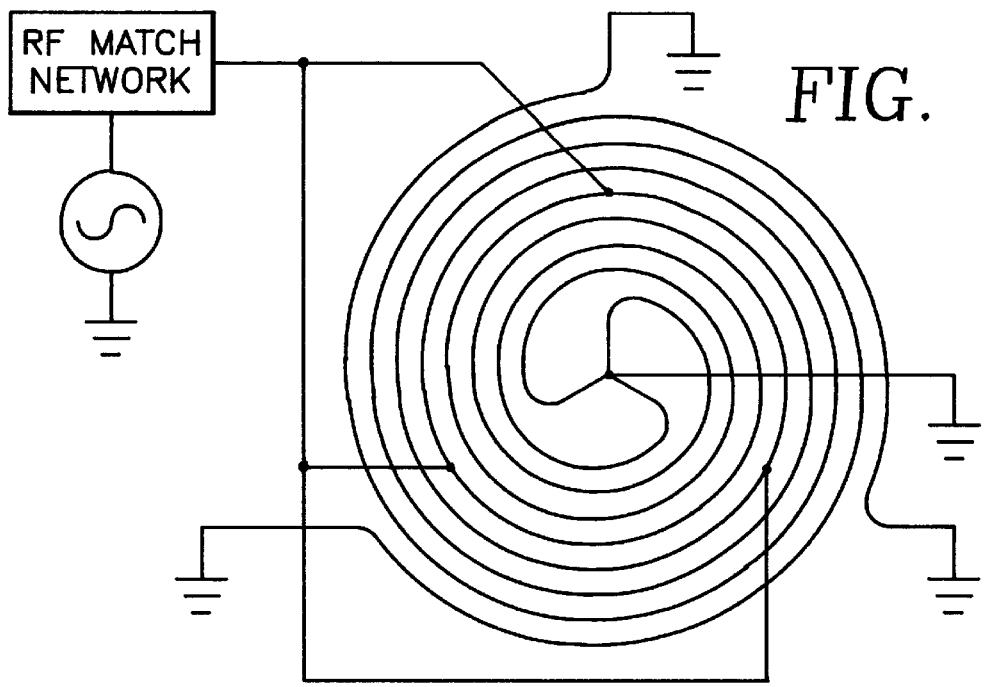
FIG. 36 is a schematic diagram corresponding to FIG. 35.

While the embodiments described above with reference to FIGS. 3A through 34 have RF power applied to either one of the two extreme ends of each winding, RF power may in fact be applied to a suitable intermediate point between the two ends, as illustrated in FIG. 35. The embodiment of FIG. 35 corresponds to that of FIG. 9, except that both terminations of each winding are grounded and RF power is applied at intermediate points 160, 165, 170 along each of the three concentric spiral windings 32, 34, 36. The location of each intermediate point 160, 165, 170 can be selected to achieve a desired RF tuning or RF matching effect, as disclosed in U.S. patent application Ser. No. 08/389,888 filed Feb. 15, 1995 by Hiroji Hanawa et al. FIG. 36 is a schematic diagram corresponding to the embodiment of FIG. 35 in which RF cower is applied to intermediate points 160, 165, 170 along the windings 32, 34, 36, with both ends of each winding being grounded. The schematic diagram of FIG. 36 is not limited to any particular shape for the multiple spiral coil, and such a coil may be flat, dome shaped, conical or cylindrical.

Figure 37:
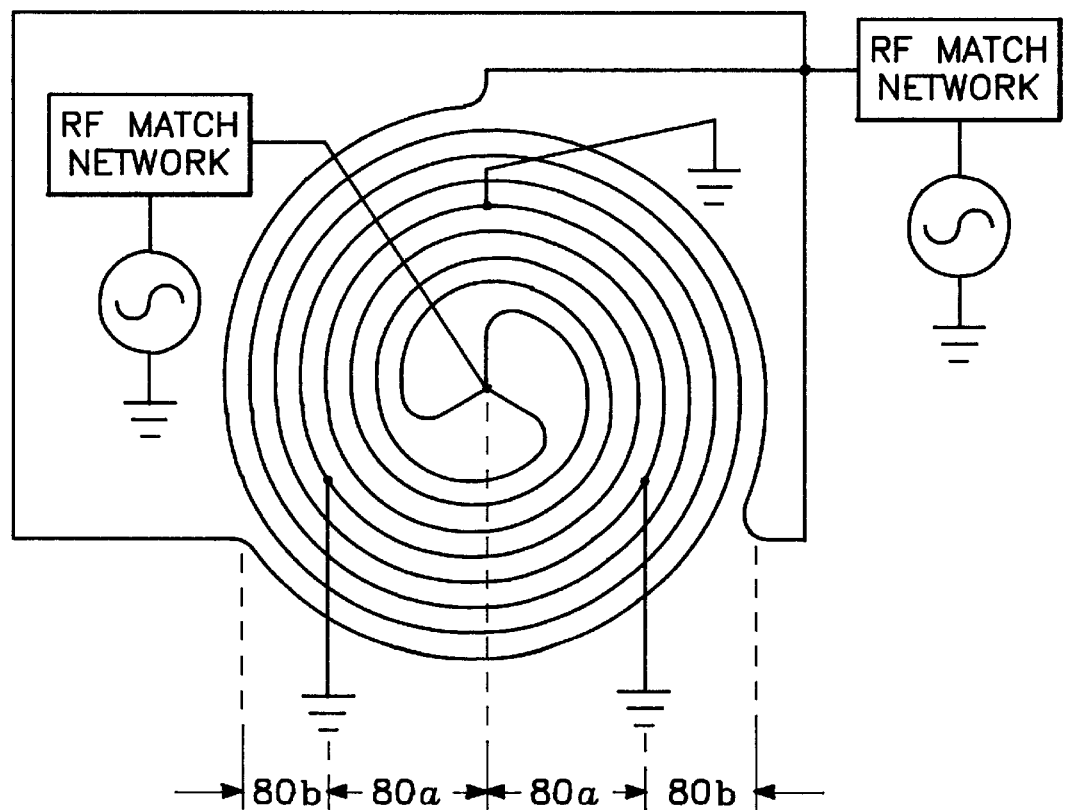
FIG. 37 is a schematic diagram corresponding to FIG. 36 in which the polarity is reversed so that the intermediate points are grounded and RF power is applied to the ends of each winding.

FIG. 37 illustrates how these connections can be reversed so that the intermediate points 160, 165, 170 along the windings are grounded and RF power is applied to both ends of each winding 32, 34, 36. The intermediate points 160, 165, 170 connected to ground divide the multiple spiral coil of FIG. 37 into radially inner and outer sections 80a, 80b, as in earlier embodiments described above. In FIG. 37, the use of two different power supplies 120, 125 facilitates differential control of RF power applied to the radially inner and outer sections of the coil. This permits adjustment or optimization of the radial distribution of plasma ion density across the wafer surface, as discussed above.

The chamber ceiling 52 is typically quartz or other suitable material, particularly in those embodiments having an overhead coil overlying the ceiling through which an RF inductive field must couple. However, for those embodiments having no overhead coil, power need not couple through the ceiling, and so the ceiling may be a conductor such as aluminum. The advantage of a conductive ceiling is that such a ceiling can provide a uniform electrical potential over the entire surface of the wafer 18. If the ceiling is, instead, a semiconductor, then it can both couple an inductive field from an overhead coil and provide a controlled electric potential over the surface of the wafer. Thus, in those embodiments having overhead concentric multiple spiral coils overlying the ceiling (i.e., the embodiments of FIGS. 3A, 3B, 4, 5, 7–17, 22–25, 27–31 and 34–37, the ceiling can be a semiconductor such as silicon acting as a window for the inductive field as well as an electrode. Such a feature is disclosed in U.S. Pat. application Ser. No. 08/597,577 filed Feb. 2, 1996 by Kenneth S. Collins and entitled "PARALLEL PLATE ELECTRODE PLASMA REACTOR HAVING AN INDUCTIVE ANTENNA COUPLING POWER THROUGH A PARALLEL PLATE ELECTRODE".

Figure 39:
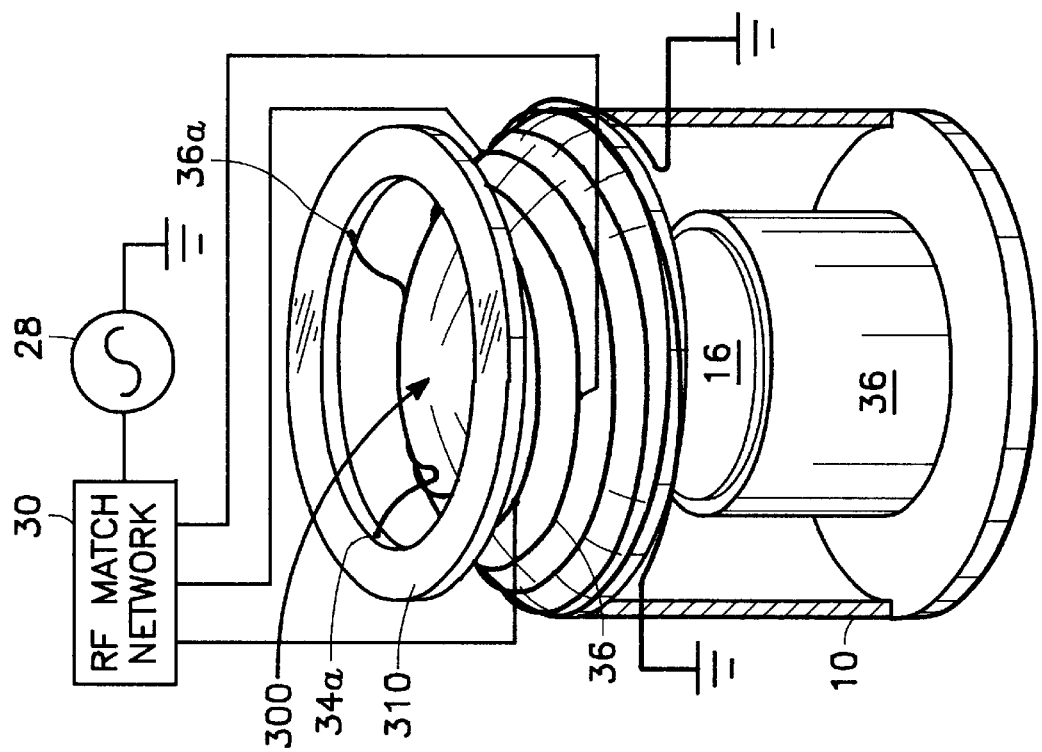
FIG. 39 illustrates an implementation of the embodiment of FIG. 39 in which the inner ends of the multiple spiral conductors are connected radially outwardly to an annular ring common connector having a diameter at least nearly as great as or greater than the outside diameter of the ceiling.
Figure 38:
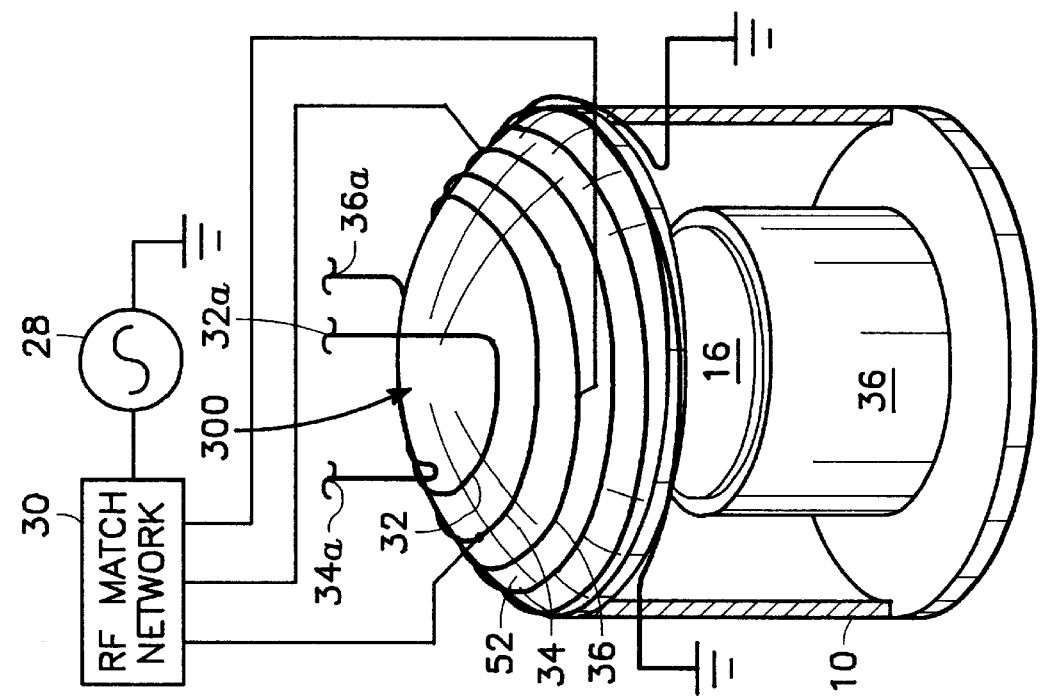
FIG. 38 illustrates an embodiment having a multiradius dome ceiling with a concentric multiple spiral coil conformal with the ceiling and having a central opening or hole to alleviate concentration of plasma ion density at the chamber center.
Figure 40:
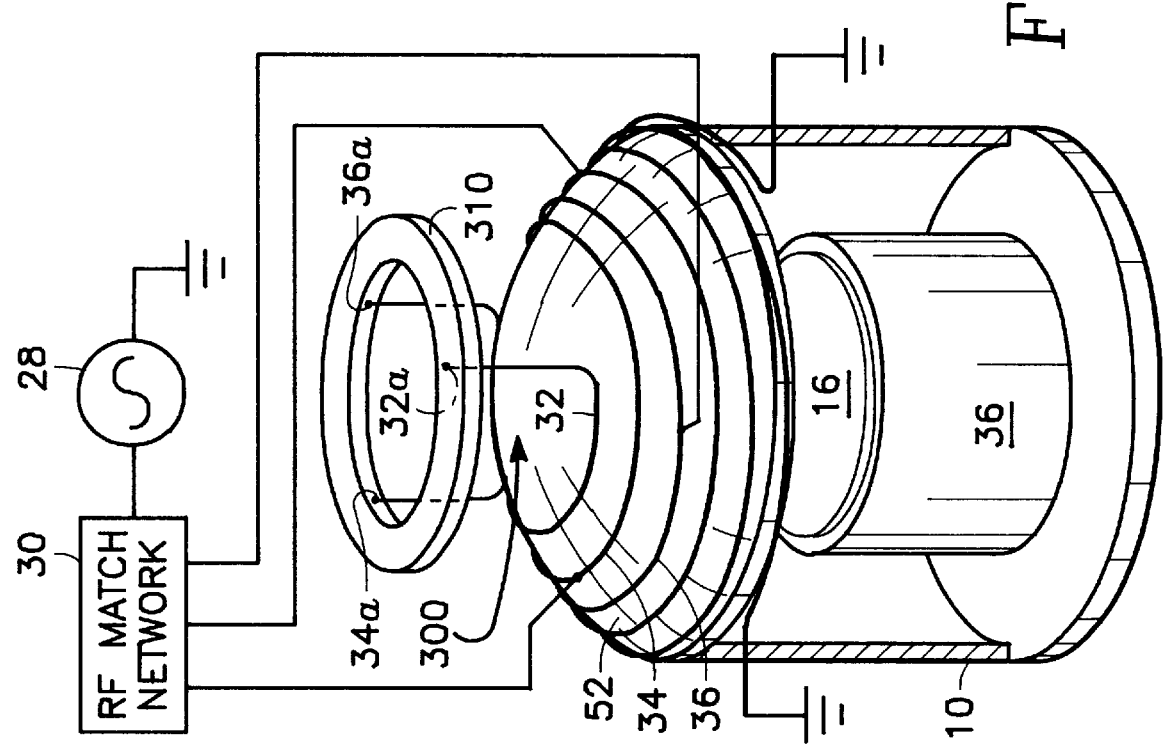
FIG. 40 illustrates an implementation of the embodiment of FIG. 39 in which the inner ends of the multiple spiral conductors are connected radially outwardly and upwardly away from the ceiling to an annular ring common conductor having a diameter less than the outside diameter of the ceiling.

Referring to FIG. 38, a multiple concentric spiral coil 32, 34, 36 conforms with a flattened or multi-radius dome-shaped ceiling 52 of a plasma reactor chamber, like the ceilings of FIGS. 14–17. The coil has a central opening 300 over the center of the ceiling to alleviate a concentration of plasma ion density at the center. In FIG. 39, the inner conductor ends 32a, 34a, 36a of the multiple spiral coil are connected radially outwardly and slightly upwardly away from the ceiling to a large diameter annular or ring-shaped common conductor 310, so as to avoid any of the conductors of the coil antenna being near the center of the ceiling 52. The large diameter of the common conductor 310 is on the order of the diameter of the ceiling 52. In FIG. 40, the common conductor 310 has a smaller diameter and is therefore radially nearer the opening 300, but to compensate for this the common conductor 310 is at a greater height above the chamber ceiling 52 (than in FIG. 39) to reduce the interaction of the conductors connected thereto with the plasma near the chamber center.

While the invention has described in detail by specific reference to preferred embodiments, it is understood that variations and modifications may be made without departing from the true spirit and scope of the invention.

What is claimed is:

1. A plasma reactor for processing a semiconductor wafer, comprising:
   a vacuum chamber having a ceiling;
   an inlet for introducing a processing gas into said vacuum chamber;
   a wafer pedestal for supporting said semiconductor wafer inside said vacuum chamber;
   an RE power source;
   a coil antenna near said vacuum chamber, said coil antenna comprising:
      plural concentric spiral conductive windings, each of said windings having a radially inward end and a radially outer end, and
      a first common conductor connected to said radially inward ends of said plural concentric spiral windings, located at a height above said ceiling;
      a second common conductor connected to said radially outer ends of said plural concentric spiral windings, said RE power source being connected to one of said first and second common conductors.

2. The plasma reactor of claim 1 wherein said RF power source comprises two terminals, one of said two terminals being an RF power terminal and the other of said two terminals being an RF return terminal connected to RF ground, said one common conductor being connected to said RF power terminal and the other of said first and second common conductors being connected to ground.

3. The plasma reactor of claim 2 wherein said one common conductor is said first common conductor and said other common conductor is said second common conductor whereby RF power is applied to said inner ends and said outer ends are connected to RF ground.

4. The plasma reactor of claim 2 wherein said one common conductor is said second common conductor and said other common conductor is said first common conductor, whereby RF power is applied to said outer ends and said inner ends are connected to ground.

5. The plasma reactor of claim 1 wherein said second common conductor is adjacent a periphery of said coil antenna and said outer ends are connected radially outwardly to said second common conductor.

6. The plasma reactor of claim 1 wherein said first common conductor is disposed near a periphery of said windings and said inner ends are connected radially outwardly to said first common conductor.

7. The plasma reactor of claim 1 wherein said first common conductor comprises a terminal disposed radially inwardly relative to said antenna coil and said inner ends are connected radially inwardly thereto.

8. The plasma reactor of claim 1 wherein said second common conductor is disposed radially inwardly relative to said antenna coil and said outer ends are connected radially inwardly thereto.

9. The plasma reactor of claim 1 wherein:
   said second common conductor is adjacent a periphery of said coil antenna and said outer ends are connected radially outwardly to said second common conductor; and
   said first common conductor is disposed near a periphery of said windings and said inner ends are connected radially outwardly to said first common conductor.

10. The plasma reactor of claim 9 wherein said coil antenna is conformal with a shape of an adjacent surface of said chamber.

11. The plasma reactor of claim 9 wherein said coil antenna is nonconformal with a shape of an adjacent surface of said chamber.

12. The plasma reactor of claim 1 wherein said ceiling comprises a three-dimensional shape and said coil antenna is disposed near said ceiling and has a three-dimensional shape deviating upwardly away from said ceiling.

13. The plasma reactor of claim 12 wherein said chamber ceiling has a dome shape and said coil antenna has a cylindrical shape and is disposed near said ceiling.

14. The plasma reactor of claim 13 wherein said inner ends are connected radially outwardly to said first common conductor so that there are no conductors of said coil antenna overlying said ceiling.

15. The plasma reactor of claim 1 wherein said ceiling comprises a planar ceiling and said antenna coil has a planar disk shape and lies on an exterior surface of said ceiling.

16. The plasma reactor of claim 1 wherein said reactor chamber comprises a cylindrical side wall and said antenna coil has a cylindrical shape and is lies on a portion of said cylindrical wall.

17. The plasma reactor of claim 1 wherein said ceiling comprises a dome-shaped ceiling and said antenna coil has a dome shape and lies on and is congruent with at least a portion of said dome-shaped ceiling.

18. The plasma reactor of claim 17 wherein said first common conductor comprises an apex terminal over a center axis of said dome shaped ceiling, and wherein said apex terminal is displaced vertically upwardly from an apex of said dome shaped ceiling, said inner ends of said concentric spiral windings being connected radially inwardly and upwardly away from said dome ceiling to said apex terminal to define a central region of said dome disposed near the apex of said dome devoid of conductors of said coil antenna.

19. The plasma reactor of claim 17 wherein said dome shape of said ceiling is truncated whereby a center region of said dome shaped ceiling is planar.

20. The plasma reactor of claim 1 wherein said reactor chamber comprises a cylindrical side wall and one portion of said antenna coil overlies said ceiling while another portion of said antenna coil is cylindrical and lies on at least a portion of said cylindrical side wall.

21. The plasma reactor of claim 2 wherein said inner ends are circumferentially spaced from one another at equal intervals and wherein said outer ends are circumferentially spaced from one another at equal intervals.

22. The plasma reactor of claim 1 wherein said chamber comprises a sidewall with said ceiling overlying said sidewall, a first portion of said coil antenna conformally overlying said sidewall and a second portion of said antenna conformally overlying said ceiling, there being a smooth transition between said first and second portions of said antenna.

23. The plasma reactor of claim 2 wherein said ceiling comprises a dome shaped ceiling underlying said coil antenna, said inner ends of said windings are spaced radially outwardly from an axis of symmetry of said ceiling and are connected to said first common conductor by respective straight line symmetrically spaced conductors.

24. The plasma reactor of claim 23 wherein said first common conductor is displaced vertically above a plane of said inner ends of said windings and said straight line conductors wick upwardly away from said inner ends toward said common terminal.

25. The plasma reactor of claim 1 wherein said coil antenna comprises a radially inner coil antenna, said reactor further comprising a radially outer coil antenna concentric with said radially inner coil antenna, said radially inner and outer coil antennas being electrically separate from one another, said plasma reactor comprising independent RF power sources individually connected to respective ones of said inner and outer coil antennas whereby RF power delivered to each coil antenna is separately controllable.

26. The plasma reactor of claim 25 wherein said radially inner and outer coil antennas are disposed near said ceiling.

27. The plasma reactor of claim 26 wherein said reactor chamber comprises a cylindrical side wall, and wherein said radially inner coil antenna overlies said ceiling and said radially outer coil antenna is disposed near said cylindrical side wall.

28. The plasma reactor of claim 27 wherein said inner coil antenna conforms in shape to said ceiling and said outer coil antenna conforms in shape to said side wall.

29. The plasma reactor of claim 27 wherein said radially inner and outer coil antennas are nonconformal in shape with said ceiling.

30. The plasma reactor of claim 29 wherein said ceiling has a three-dimensional shape and said radially inner and outer coil antennas have respective three-dimensional shapes which are nonconformal with the three dimensional shape of said ceiling.

31. The plasma reactor of claim 30 wherein said ceiling is dome shaped and said inner and outer coil antennas are, respectively, planar and cylindrical.

32. The plasma reactor of claim 1 wherein said RF power source comprises two terminals, one of said two terminals being an RF power terminal and the other of said two terminals being an RF return terminal connected to RF ground, said common conductor being connected to one of said two terminals and the other of said first and second common conductors being connected to the other of said two terminals.

33. A plasma reactor for processing a semiconductor wafer, comprising:
 a vacuum chamber;
 an inlet for introducing a processing gas into said vacuum chamber;
 a wafer pedestal for supporting said semiconductor wafer inside said vacuum chamber;
 a first RF power source;
 a coil antenna near said vacuum chamber, said coil antenna comprising:
  plural concentric spiral conductive windings, each of said windings having a radially inward end and a radially outer end, and
  a first common conductor connected to said radially inward ends of said plural concentric spiral windings, a second common conductor connected to said radially outer ends of said plural concentric spiral windings, and a third common conductor connected to an intermediate point on each of said windings intermediate said inner and outer ends thereof, said first RF power source being connected across said third common conductor and at least one of said first and second common conductors.

34. The plasma reactor of claim 33 wherein said first RF power source is connected between RF ground and said third common conductor and said first and second common conductors are RF grounded.

35. The plasma reactor of claim 33 wherein said first RF power source is connected across at least one of said first and second common conductors and RF ground and said third common conductor is connected to RF ground.

36. The plasma reactor of claim 35 further comprising a second RF power source connected across the other of said first and second common conductors and RF ground, said first and second RF power sources being independently controllable, whereby said coil antenna is divided into inner and outer coil antenna sections by said intermediate points connected to said third common conductor.

37. A coil antenna for radiating power from a power source into a vacuum chamber of a plasma reactor which processes a semiconductor wafer in said vacuum chamber, said reactor having a ceiling and a gas supply inlet for supplying processing gases into said vacuum chamber, said coil antenna comprising:
 a first group of plural concentric spiral conductive windings, each of said windings of said first group having an interior end and an outer end, each said winding spirally radially outward from said interior end to said outer end, each of said interior ends of said first group of plural concentric spiral conductive windings located at a height above said ceiling.

38. The coil antenna of claim 37 further comprising:
 a second group of plural concentric spiral conductive windings coaxial with and said first group of plural concentric spiral conductive windings, each of said windings of said second group having an interior end near a circumferential periphery of said first group and an outer end, each said winding spiraling radially outward from said interior end to said outer end, said first and second groups of windings being electrically separate and independently controllable.

39. A plasma reactor for processing a semiconductor wafer, comprising:
 a vacuum chamber having a three-dimensionally shaped ceiling;
 a process gas inlet into said vacuum chamber;
 a wafer pedestal for supporting said semiconductor wafer inside said vacuum chamber;
 an RF power source;
 a coil antenna receiving power from aid RF power source and overlying said ceiling, said coil antenna comprising:
  plural concentric spiral conductive windings, each of said windings having a radially inward end and a radially outer end, and
  a first common conductor connected to said radially inward ends of said plural concentric spiral windings, a second common conductor connected to said radially outer ends of said plural concentric spiral windings,
  wherein said first common conductor comprises a center terminal near a center of said plural concentric spiral conductive windings, said center terminal being located at a height above a center portion of said ceiling, said inner ends being connected radially inwardly and upwardly to said center terminal, whereby to leave a center portion of said ceiling spaced from conductors of said coil antenna.

40. The plasma reactor of claim 39 wherein said coil antenna is generally conformal in shape with said ceiling except near said center portion.

41. The plasma reactor of claim 39 herein said RF power source is coupled to at least one of said first and second common conductors.

42. The plasma reactor of claim 41 wherein said RF power source is coupled across said first and second common conductors.

43. The plasma reactor of claim 41 wherein said RF power source is coupled across one of said first and second common conductors and a point intermediate said inner and outer ends of each winding.

44. The plasma reactor of claim 43 further comprising a second power source connected across said intermediate point and the other one of said first and second common conductors.

45. An inductively coupled plasma reactor with a radially symmetrical three-dimensionally shaped array of parallel spiral concentric windings having an opening at a radial center region thereof, each of said parallel spiral concentric windings having an inner end located at a height above said opening.

46. The reactor of claim 45 wherein said array of windings is in a dome shape.

47. The reactor of claim 46 wherein said dome shape is a multi-radius dome shape.

48. A plasma reactor for processing a semiconductor wafer, comprising:

a vacuum chamber having a multi-radius dome-shaped ceiling;

a process gas inlet into said vacuum chamber;

a wafer pedestal for supporting said semiconductor wafer inside said vacuum chamber;

an RF power source;

a coil antenna receiving power from said RF power source and overlying and being at least generally conformal in shape with said multi-radius dome-shaped ceiling, said coil antenna comprising plural concentric spiral conductive windings, each of said windings having a radially inward end and a radially outer end, said radially inward ends being disposed such that said coil antenna has a central opening with no conductors therein.

49. The reactor of claim 48 further comprising a common conductor to which said radially inward ends are connected.

50. The reactor of claim 49 wherein said common conductor comprises an annular conductor having a diameter greater than that of said opening whereby said radially inward ends are connected radially outwardly thereto.

51. The reactor of claim 50 wherein said common conductor has a diameter on the order of said ceiling.

52. The reactor of claim 51 wherein said common conductor is disposed vertically upwardly away from said ceiling, whereby said radially inward ends are connected radially outwardly and vertically upwardly to said common conductor.

53. The reactor of claim 48 wherein said connections of said radially inward ends to said common conductor proceed along vertically upward paths and thereafter along radially outward paths.

54. The reactor of claim 52 wherein said common conductor has a diameter on the order of said ceiling.

55. The reactor of claim 53 wherein said common conductor has a diameter less than that of said ceiling.

56. The reactor of claim 48 wherein said common conductor comprises an apex terminal to which said radially inward ends are connected radially inwardly.

* * * * *